(12) United States Patent
Hsieh et al.

(10) Patent No.: US 11,258,971 B2
(45) Date of Patent: Feb. 22, 2022

(54) MULTI-FUNCTION TRANSFER GATE ELECTRODE FOR A PHOTODETECTOR AND METHODS OF OPERATING THE SAME

(71) Applicant: Taiwan Semiconductor Manufacturing Company Limited, Hsinchu (TW)

(72) Inventors: Feng-Chien Hsieh, Pingtung (TW); Wei-Li Hu, Tainan (TW); Kuo-Cheng Lee, Tainan (TW); Hsin-Chi Chen, Tainan (TW); Yun-Wei Cheng, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/885,364

(22) Filed: May 28, 2020

(65) Prior Publication Data
US 2021/0377481 A1 Dec. 2, 2021

(51) Int. Cl.
*H04N 5/3745* (2011.01)
*H04N 5/369* (2011.01)
(Continued)

(52) U.S. Cl.
CPC ........... *H04N 5/3745* (2013.01); *H04N 5/379* (2018.08); *H01L 27/1463* (2013.01);
(Continued)

(58) Field of Classification Search
CPC .. H04N 5/3745; H04N 5/379; H01L 31/1892; H01L 27/14685; H01L 27/14621;
(Continued)

(56) References Cited

U.S. PATENT DOCUMENTS

| | | | |
|---|---|---|---|
| 10,244,188 B2 * | 3/2019 | Saylor | ...................... H04N 5/33 |
| 2016/0028985 A1 | 1/2016 | Vogelsang et al. | |

(Continued)

FOREIGN PATENT DOCUMENTS

TW      201904271 A      1/2019

OTHER PUBLICATIONS

Taiwan Patent Office TIPO, Office Action dated Sep. 23, 2021 for TW Application No. 11020923590, 7 pages.

*Primary Examiner* — Gevell V Selby
(74) *Attorney, Agent, or Firm* — The Marbury Law Group, PLLC

(57) ABSTRACT

A photodetector circuit includes a photodetector and a sensing circuit located over a substrate semiconductor layer having a doping of a first conductivity type. The photodetector includes a second-conductivity-type pinned photodiode layer that forms a p-n junction with the substrate semiconductor layer, at least one floating diffusion region that is laterally spaced from a periphery of the second-conductivity-type pinned photodiode layer, and at least one transfer gate electrode. At least two different operations may be performed by applying at least two different pulse patterns to the at least one transfer gate electrode. The at least two different pulse patterns differ from one another or from each other by at least one of pulse duration, pulse magnitude, and delay time between a control signal applied to the sensing circuit and pulse initiation at a respective one of the at least one transfer gate electrode.

20 Claims, 29 Drawing Sheets

2210 — providing a device including an instance of a photodetector circuit, wherein the photodetector circuit includes a photodetector and a sensing circuit 2220 — performing at least two different operations in the instance of the photodetector circuit by applying at least two different pulse patterns to the at least one transfer gate electrode

(51) Int. Cl.
*H01L 27/146* (2006.01)
*H01L 31/18* (2006.01)

(52) U.S. Cl.
CPC .. *H01L 27/14621* (2013.01); *H01L 27/14627* (2013.01); *H01L 27/14629* (2013.01); *H01L 27/14645* (2013.01); *H01L 27/14685* (2013.01); *H01L 27/14689* (2013.01); *H01L 31/1892* (2013.01)

(58) Field of Classification Search
CPC ......... H01L 27/14645; H01L 27/14689; H01L 27/14627; H01L 27/14629; H01L 27/1463
See application file for complete search history.

(56) References Cited

U.S. PATENT DOCUMENTS

| | | | |
|---|---|---|---|
| 2017/0366726 A1* | 12/2017 | Yanagida | H04N 5/376 |
| 2019/0339392 A1* | 11/2019 | Manabe | H04N 5/353 |
| 2020/0007804 A1 | 1/2020 | Guidash et al. | |
| 2020/0027909 A1* | 1/2020 | Ebiko | G01S 17/36 |
| 2020/0275043 A1* | 8/2020 | Ma | H04N 5/37457 |

* cited by examiner

MULTI-FUNCTION TRANSFER GATE ELECTRODE FOR A PHOTODETECTOR AND METHODS OF OPERATING THE SAME

BACKGROUND

Semiconductor image sensors are used to sense electromagnetic radiation such as visible range light, infrared radiation, and/or ultraviolet light. Complementary metal-oxide-semiconductor (CMOS) image sensors (CIS) and charge-coupled device (CCD) sensors are used in various applications such as digital cameras or embedded cameras in mobile devices. These devices utilize an array of pixels (which may include photodiodes and transistors) to detect radiation using photogeneration of electron-hole pairs. In the prior art, each pixel in an array is designed for a respective dedicated single function.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
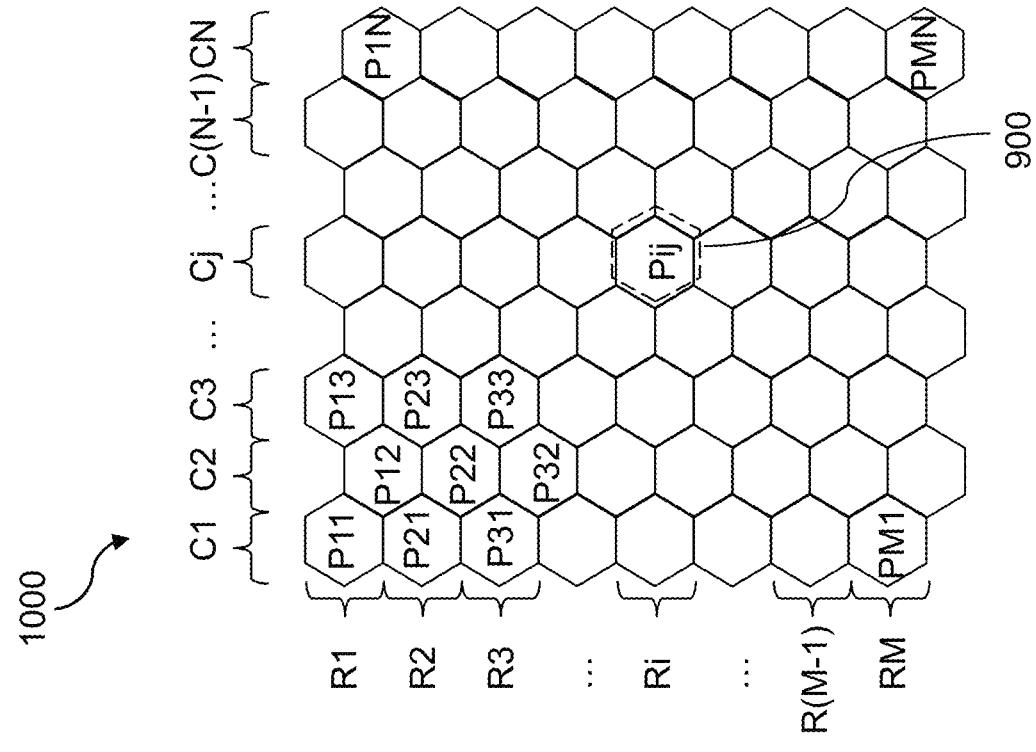
FIG. 1B is a plan view of a second configuration for an array of pixels of an image sensor according to another embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to a photodetector including at least one multi-function transfer gate electrode and methods of operating the same.

Generally, the structures and methods of the present disclosure may be used to provide multiple functions for a subpixel that includes a photodiode circuit. The photodetector circuit includes a photodetector and a sensing circuit. The photodetector includes a second-conductivity-type pinned photodiode layer that forms a p-n junction with a substrate semiconductor layer, at least one floating diffusion region that is laterally spaced from a periphery of the second-conductivity-type pinned photodiode layer, and at least one transfer gate electrode. At least two different operations may be performed in the photodetector circuit by applying at least two different pulse patterns to the at least one transfer gate electrode. The at least two different pulse patterns differ from one another or from each other by at least one of pulse duration, pulse magnitude, and delay time between a control signal applied to the sensing circuit and pulse initiation at a respective one of the at least one transfer gate.

The at least two different operations may provide at least two different functions for the photodetector. One of the at least two different operations may include an image capture operation that generates an electrical output from the sensing circuit. The electrical output having a magnitude in proportion to a quantity of electrical charges that accumulates in the second-conductivity-type pinned photodiode layer. In some embodiments, the photodetector may continue to perform its typical operation as an image sensor. Another of the at least two different operations may include an additional operation for enhancing the quality of the image captured by the CMOS image sensor.

In one embodiment, the additional operation may be related to internal operation of an individual subpixel such as a pinning operation that accumulates charge carriers of the first conductivity type in a first-conductivity-type pinning layer that forms another p-n junction with the second-conductivity-type pinned photodiode layer. In another embodiment, the additional function may be related to an overflow discharge operation in which electrical charges in the second-conductivity-type pinned photodiode layer are drained prior to performing the image capture operation. In another embodiment, the additional function may be related to global operation of a CMOS image sensor and is not related to image generation from any particular subpixel. For example, the additional function or the additional operation may include a single operation or a plurality of operations that is/are selected from a list including, but not limited to, a phase detection autofocus operation, a time-of-flight detection operation, a single-photon avalanche diode operation, and a near-infrared operation. The various aspects of embodiments of the present disclosure are described herebelow in reference to various drawings of the instant application.

Figure 1A:
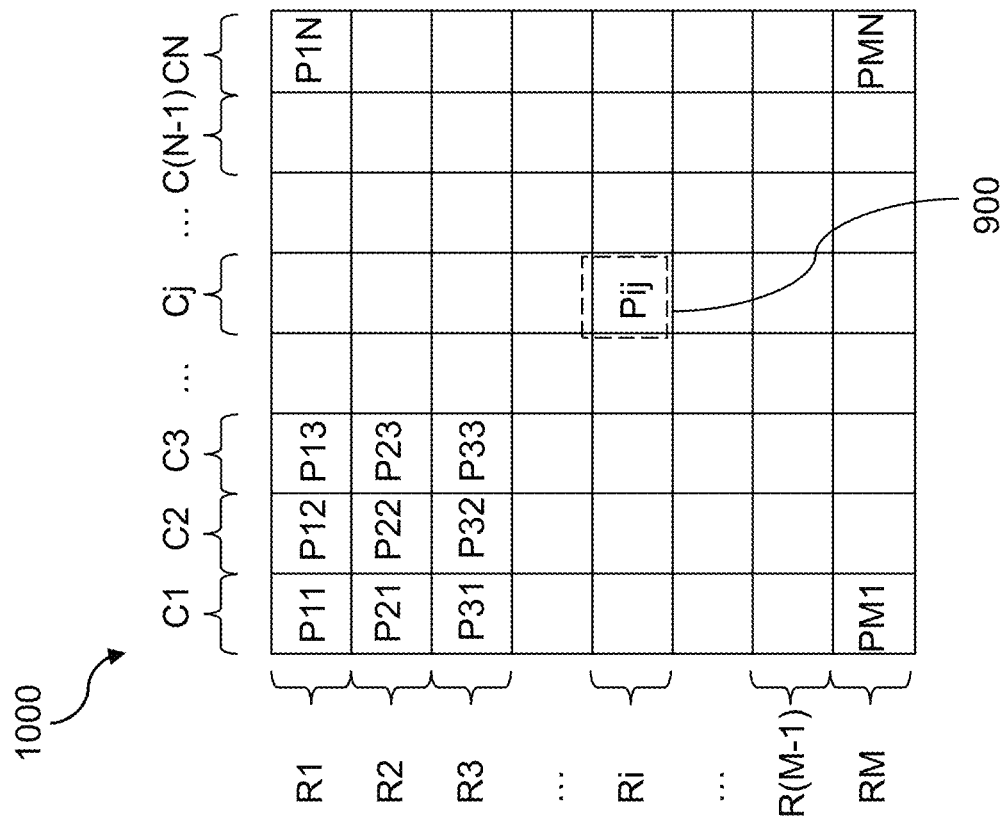
FIG. 1A is a plan view of a first configuration for an array of pixels of an image sensor according to an embodiment of the present disclosure.

Referring to FIGS. 1A and 1B, a first configuration for an array 1000 of pixels 900 of an image sensor and a second configuration of an array 1000 of pixels 900 of an image sensor are illustrated in a respective plan view. The image sensor may be a backside illuminated (BSI) image sensor device. However, it should he appreciated that embodiments of the disclosure may be used in a front side illuminated (FSI) image sensor.

Each pixel 900 represents a smallest unit area for the purpose of generating an image from the image sensor. The region including the array 1000 of pixels 900 is herein referred to as a pixel array region. The pixels 900 in the pixel array region may be arranged in rows and columns. For example, the pixel array region may include M rows and N columns, in which M and N are integers in a range from 1 to $2^{16}$, such as from $2^8$ to $2^{14}$. The rows of pixels 900 may be consecutively numbered with integers that range from 1 to M, and the columns of pixels 900 may be consecutively numbered with integers that range from 1 to N. A pixel $P_{ij}$ refers to a pixel 900 in the i-th row and in the j-th column.

Each pixel 900 includes at least one photodetector that is configured to detect radiation of a given wavelength range. Each pixel 900 may include a plurality of photodetectors configured to detect radiation of a respective wavelength range, which may be different from each of the plurality of photodetectors. In one embodiment, each pixel 900 may include a plurality of subpixels, each of which including a respective combination of a photodetector and an electronic circuit configured to detect radiation that impinged into the photodetector. For example, a pixel 900 may include a subpixel configured to detect radiation in a red wavelength range (such as a range from 635 nm to 700 nm), a subpixel configured to detect radiation in a green wavelength range (such as a range from 520 nm to 560 nm), and a subpixel configured to detect radiation in a blue wavelength range (such as a range from 450 nm to 490 nm). Such subpixels are referred to as a red subpixel, green subpixel, and a blue subpixel, respectively.

Generally, a pixel 900 generates information in impinging radiation for a unit detection area. A subpixel generates information on the intensity of the impinging radiation within a specific wavelength range as detected within a region of the unit detection area. A monochromatic pixel 900 may include only a single subpixel. A pixel 900 configured to detect spectral distribution of impinging radiation includes multiple subpixels having at least two different detection wavelength ranges. Photodetectors in a pixel array region may include photodiodes, complimentary metal-oxide-semiconductor (CMOS) image sensors, charged coupling device (CCD) sensors, active sensors, passive sensors, other applicable sensors, or a combination thereof.

Figure 2A:
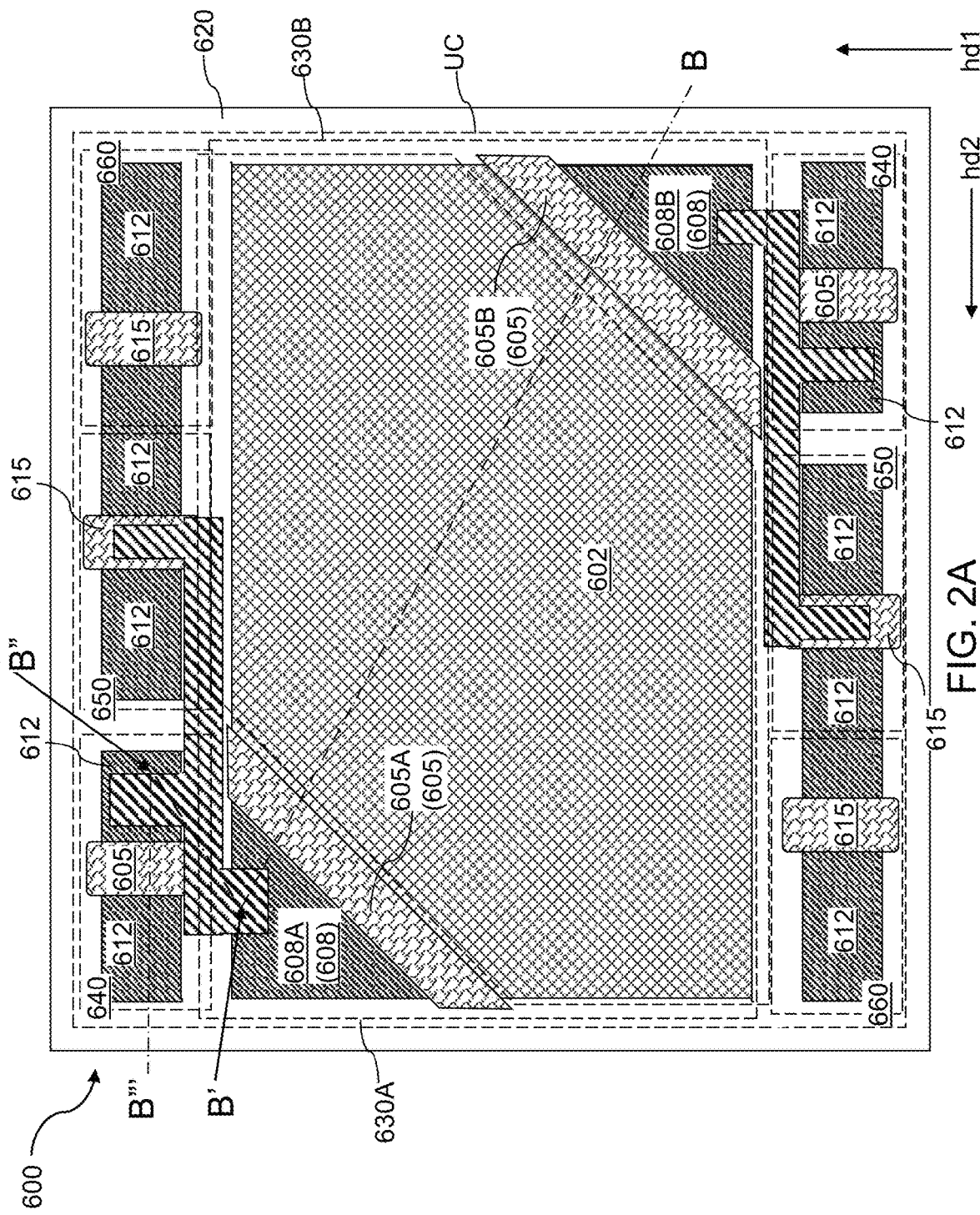
FIG. 2A is a plan view of front side sensor components within the area of a subpixel in a first configuration of a first exemplary structure according to an embodiment of the present disclosure.
Figure 2B:
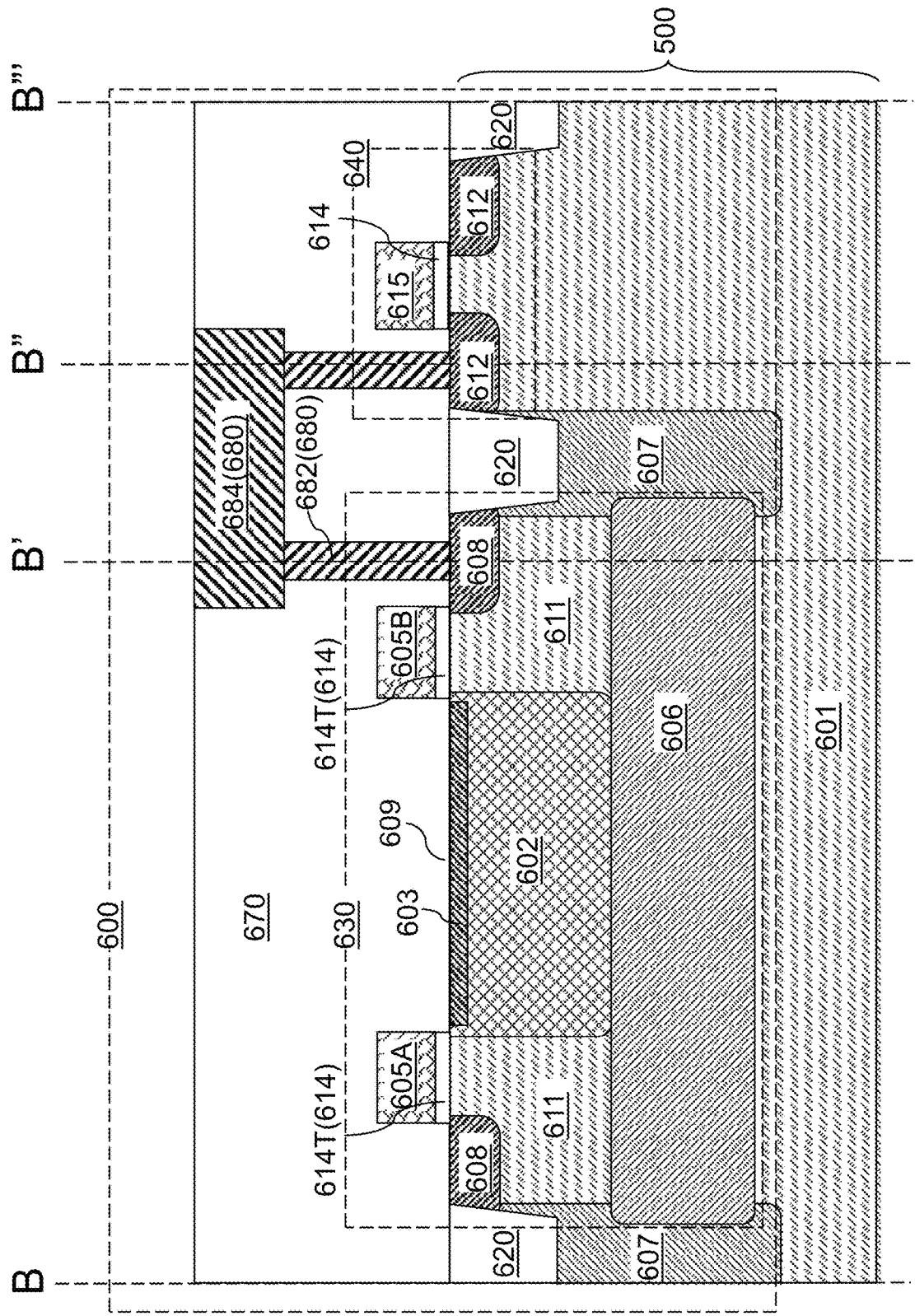
FIG. 2B is a vertical cross-sectional view of the first exemplary structure along the hinged vertical plane B-B'-B"-B"' of FIG. 2A.

Referring to FIGS. 2A and 2B, a first configuration of a photodetector circuit in a first exemplary structure is illustrated according to an embodiment of the present disclosure. A photodetector circuit includes a set of front side sensor components 600 within the area of a subpixel. Front side sensor components 600 refer to all components of the image sensor that may be formed on the front surface 609 of a semiconductor substrate 500, or may be formed within the substrate semiconductor layer 601. The photodetector circuit includes a photodetector (comprising a transfer transistor 630) and a sensing circuit (640, 650, 660) that includes a plurality of reset transistors 640, a plurality of source follower transistors 650, and a plurality of select transistors 660.

Each subpixel may include a respective photodetector circuit, which includes a subset of the front side sensor components 600 that may be located within the area of a subpixel. The various configurations of the photodetector may be derived from each other by changing the layout of a pinned photodiode layer that comprises a second-conductivity-type pinned photodiode layer 602, at least two floating diffusion regions 608, and at least two transfer gate stack structures (614T, 605). The various configurations for the sensing circuit (640, 640, 650) may be derived from one another by changing a total number of interconnected set of a reset transistor 640, a source follower transistor 650, and a selector transistor 650 and/or by rearranging the layout of interconnected sets of a reset transistor 640, a source follower transistor 650, and a selector transistor 650.

A set of subpixels may be used for a pixel, and an array 1000 of pixels may be arranged as illustrated in FIG. 1A or in FIG. 1B, or in any other suitable array configurations to provide an image sensor. Each subpixel may comprise a unit cell UC, which may be repeated along at least one horizontal direction to provide front side sensor components 600 for a single pixel, which may include a single subpixel, two subpixels, or three or more subpixels. In one embodiment, multiple instances of the unit cell UC may be repeated along at least one horizontal direction. For example, the unit cell UC may be repeated as a two-dimensional array of unit cells UC that are replicated with a first periodicity along a first horizontal direction hd1 and with a second periodicity along a second horizontal direction hd2. As discussed above with reference to FIGS. 1A and 1B, the two-dimensional array may be a rectangular array or a hexagonal array. As such, the second horizontal direction hd2 may, or may not, be perpendicular to the first horizontal direction hd1.

FIG. 2B is a vertical cross-sectional view of the first exemplary structure along the hinged vertical plane B-B' of FIG. 2A. With reference to FIG. 2B, the semiconductor substrate 500 includes a substrate semiconductor layer 601. Each subpixel may be formed on, or in, the substrate semiconductor layer 601, which has a front surface 609 and a back surface. The substrate semiconductor layer 601 includes a semiconductor material such as silicon, germanium, a silicon-germanium alloy, a compound semiconductor material, or any other semiconductor material having a band gap that that does not exceed the energy of the photons to be detected. The material within the substrate semiconductor layer 601 may be selected based on the energy range of the photons to be detected by the subpixel. In one embodiment, the substrate semiconductor layer 601 may include single crystalline silicon. A commercially available single crystalline semiconductor substrate may be used for the semiconductor substrate 500. The semiconductor substrate 500 as provided at this processing step has a sufficiently high thickness to be able to withstand standard complementary metal-oxide-semiconductor (CMOS) processing steps. For example, the thickness of the semiconductor substrate 500 may be in a range from 200 microns to 1 mm, although lesser and greater thicknesses may also be used.

A top portion of the substrate semiconductor layer 601 may be suitably doped to have a first conductivity type, which may be p-type or n-type. For example, an epitaxial semiconductor deposition process may be performed to form a single crystalline epitaxial semiconductor material layer at an upper portion of the substrate semiconductor layer such that the atomic concentration of the dopants of the first conductivity type is in a range from $1.0\times10^{13}/cm^3$ to $1.0\times10^{16}/cm^3$, although lesser and greater atomic concentrations may also be used. The thickness of the single crystalline epitaxial semiconductor material layer may be in a range from 1 micron to 10 microns, although lesser and greater thicknesses may also be used.

First-conductivity-type wells 607 may be formed by ion implantation around regions in which shallow trench isolation structures 620 are to be subsequently formed. The atomic concentration of dopants of the first conductivity type in the first-conductivity-type wells 607 may be in a range from $1.0\times10^{15}/cm^3$ to $1.0\times10^{18}/cm^3$, although lesser and greater atomic concentrations may also be used. Shallow trench isolation structures 620 may be formed to provide electrical isolation to and from the various components within the subpixel.

Dopants of a second conductivity type may be implanted through the front surface 609 of the semiconductor substrate 500 using at least one masked ion implantation process. The second conductivity type is the opposite of the first conductivity type. For example, if the first conductivity type is p-type, the second conductivity type is n-type, and vice versa. Various doped regions having a doping of the second conductivity type is formed by the at least one masked ion implantation process. A second-conductivity-type pinned photodiode layer 602 may be formed underneath the front surface 609 of the semiconductor substrate 500 such that a periphery of the second-conductivity-type pinned photodiode layer 602 overlaps with an edge of the transfer gate electrodes 605 in a plan view. The lateral extent of the second-conductivity-type pinned photodiode layer 602 may be limited to one side of a transfer gate electrode to be subsequently formed. Thus, at least one edge of the second-conductivity-type pinned photodiode layer 602 may be laterally spaced from the shallow trench isolation structures 620 by a region in which a transfer gate electrode and a floating diffusion region may be subsequently formed.

A buried second-conductivity-type pinned photodiode layer 606 may be formed underneath the second-conductivity-type pinned photodiode layer 602 at the depth of the bottom portions of the first-conductivity-type wells 607 by implanting dopants of the second conductivity type with a higher implantation energy than during the implantation process that forms the second-conductivity-type pinned photodiode layer 602. The buried second-conductivity-type pinned photodiode layer 606 may adjoin the first-conductivity-type wells 607. In one embodiment, each buried second-conductivity-type pinned photodiode layer 606 may have a periphery that adjoins the first-conductivity-type wells 607.

In one embodiment, a p-n junction between the buried second-conductivity-type pinned photodiode layer 606 and the first-conductivity-type wells 607 may continuously extend around the entire area of a subpixel to form a generally cylindrical surface without any opening therethrough. The p-n junction may continuously extend underneath portions of a shallow trench isolation structure 620 that laterally surround the subpixel. The top portion of the buried second-conductivity-type pinned photodiode layer 606 may be adjoined to the bottom portion of the second-conductivity-type pinned photodiode layer 602 within each subpixel. The area of the second-conductivity-type pinned photodiode layer 602 may be located entirely within the area of the underlying buried second-conductivity-type pinned photodiode layer 606 in each subpixel.

In one embodiment, the depth of the top surface of the buried second-conductivity-type pinned photodiode layer 606 may be in a range from 400 nm to 1,500 nm, although lesser and greater depths may also be used. In one embodiment, the depth of the bottom surface of the buried second-conductivity-type pinned photodiode layer 606 may be in a range from 800 nm to 2,500 nm, although lesser and greater depths may also be used.

The unimplanted portion of the substrate semiconductor layer 601 that overlies the buried second-conductivity-type pinned photodiode layer 606 has a doping of the first conductivity type, and may be subsequently used as a body region of a transfer transistor. As such, the unimplanted portion of the substrate semiconductor layer 601 that overlies the buried second-conductivity-type pinned photodiode layer 606 is herein referred to as a transfer transistor body region 611. In one embodiment, the buried second-conductivity-type pinned photodiode layer 606 may have the same lateral extent as a transfer transistor 630 to be subsequently formed, and may coincide with the portion of the shallow trench isolation structure 620 that encircles the combination of the second-conductivity-type pinned photodiode layer 602 and the transfer transistor body region 611.

Gate stack structures (614, 605, 615) may be formed over the front surface 609 of the semiconductor substrate 500 by depositing and patterning a layer stack including a gate dielectric layer and a gate electrode layer. Each patterned portion of the layer stack constitutes a gate stack structure (614, 605, 615), which may be a transfer gate stack structure (614T, 605) and a control gate stack structure (614, 615). Each transfer gate stack structure (614T, 605) includes a gate dielectric, which is herein referred to as a transfer gate dielectric 614T, and a gate electrode, which is herein referred to as a transfer gate electrode 605. Each transfer gate stack structure (614T, 605) is located between the second-conductivity-type pinned photodiode layer 602 and a respective one of the floating diffusion regions 608. Each control gate stack structure (614, 615) includes a gate dielectric 614 and a gate electrode 615.

Figure 2C:
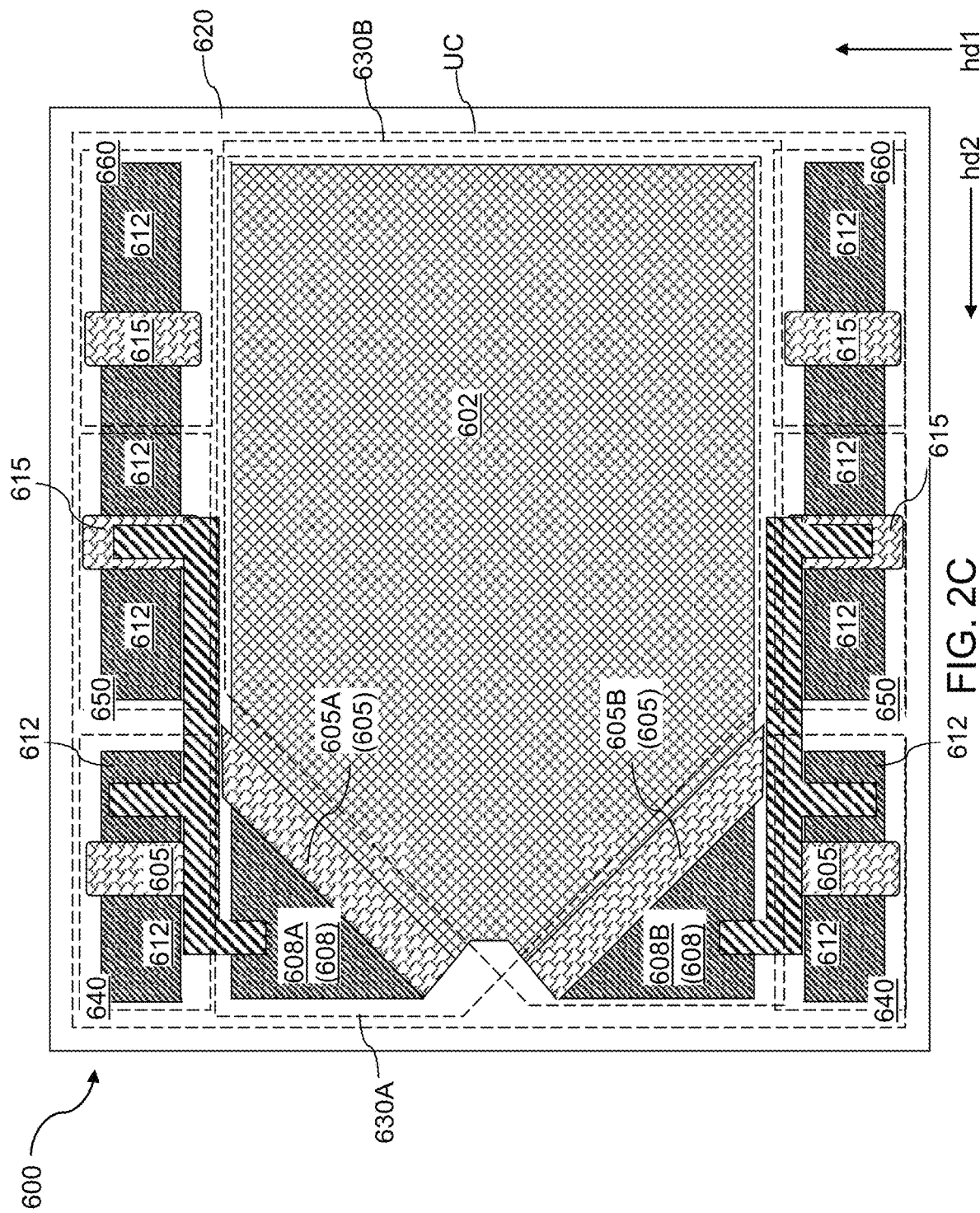
FIG. 2C is a plan view of front side sensor components within the area of a subpixel in a second configuration of the first exemplary structure according to an embodiment of the present disclosure.

Referring to FIG. 2C, a second configuration of the first exemplary structure is illustrated, which can be derived from the first configuration of the first exemplary structure of FIGS. 2A and 2B by changing the layout for the first floating diffusion region 608A, the second floating diffusion region 608B, the first transfer gate electrode 605A, and the second transfer gate electrode 605B. Specifically, the first floating diffusion region 608A and the second floating diffusion region 608B can be formed adjacent to each other in the second configuration of FIG. 2C instead of a diagonal arrangement employed in the first configuration of the first exemplary structure of FIGS. 2A and 2B.

Figure 2D:
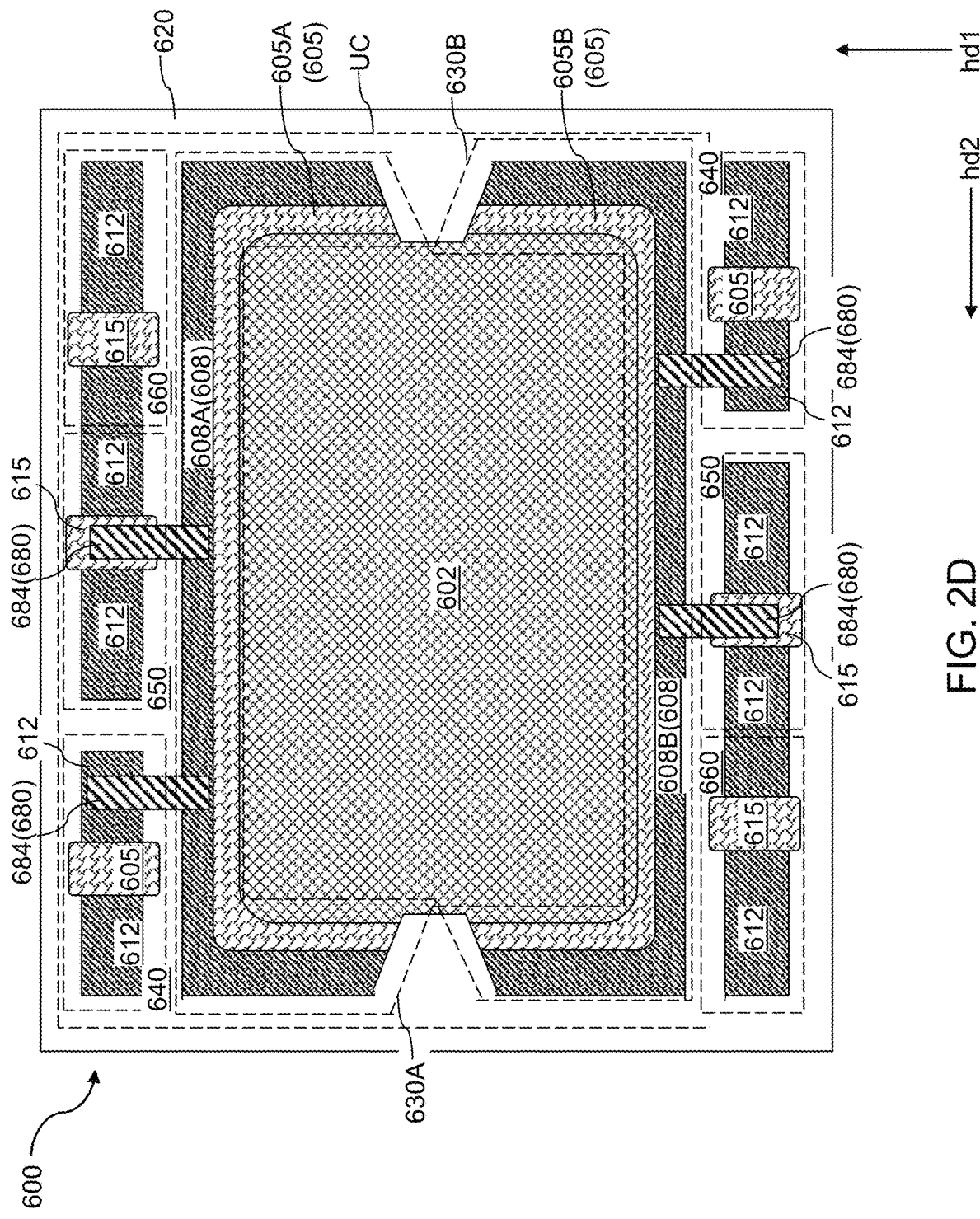
FIG. 2D is a plan view of front side sensor components within the area of a subpixel in a third configuration of the first exemplary structure according to an embodiment of the present disclosure.

Referring to FIG. 2D, a third configuration of the first exemplary structure is illustrated, which can be derived from the first configuration of the first exemplary structure of FIGS. 2A and 2B by changing the layout for the first floating diffusion region 608A, the second floating diffusion region 608B, the first transfer gate electrode 605A, and the second transfer gate electrode 605B. Specifically, the first floating diffusion region 608A and the second floating diffusion region 608B can be formed in the shapes or arcs in the third configuration of FIG. 2D instead of a diagonal arrangement employed in the first configuration of the first exemplary structure of FIGS. 2A and 2B.

Figure 2E:
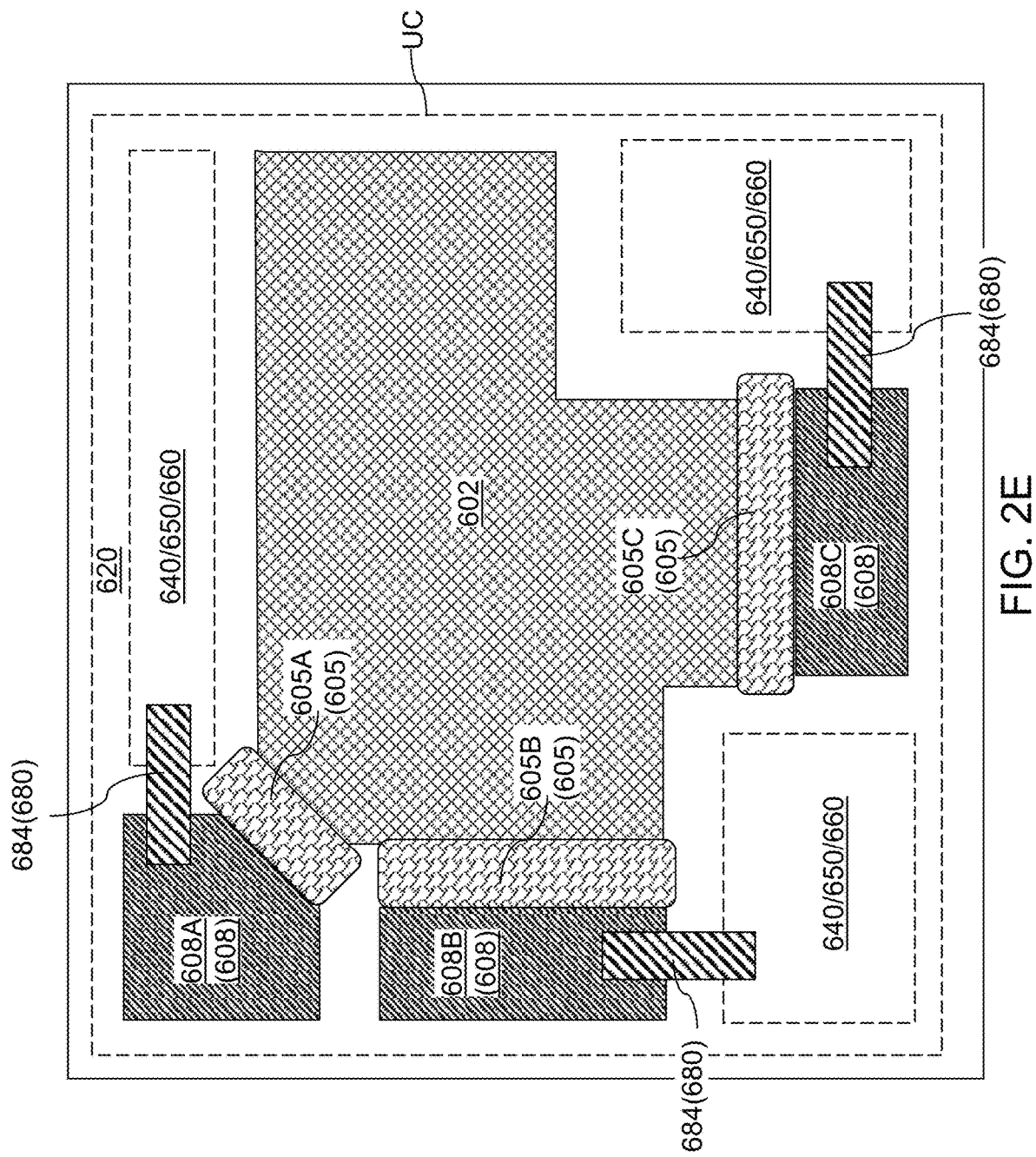
FIG. 2E is a plan view of front side sensor components within the area of a subpixel in a fourth configuration of the first exemplary structure according to an embodiment of the present disclosure.

Referring to FIG. 2E, a fourth configuration of the first exemplary structure is illustrated, which can be derived from the first configuration of the first exemplary structure of FIGS. 2A and 2B by forming three of more floating diffusion regions and three or more transfer gate electrodes. For example, the floating diffusion regions can include a first floating diffusion region 608A, a second floating diffusion region 608B, and a third floating diffusion region 608C. The transfer gate electrodes can include a first transfer gate electrode 605A, a second transfer gate electrode 605B, and a third transfer gate electrode 605C.

Each floating diffusion region (608A, 608B, 608C) in each configuration of the first exemplary structure illustrated in FIGS. 2A-2E can be connected to a respective combination of a reset transistor 640, a source follower transistor 650, and a select transistor 660. In each configuration, the transfer gate dielectric 614T has the same horizontal cross-sectional shape as the transfer gate electrode 605.

According to an aspect of the present disclosure, a plurality of transfer gate stack structures (614T, 605) may be formed within each photodetector circuit as illustrated in FIGS. 2A-2E. Each transfer gate stack structure (614T, 605) is a gate stack structure of a transfer transistor 630, and includes a stack of a gate dielectric 614 and a transfer gate electrode 605. The transfer gate electrodes 605 of the photodetector circuit may include a first transfer gate electrode 605A and a second transfer gate electrode 605B. In embodiments in which three or more transfer gate electrodes 605 are provided (for example, as illustrated in FIG. 2E), the transfer gate electrodes 605 may include a third transfer gate electrode 605C. In embodiments in which four or more transfer gate electrodes 605 are provided, at least one additional transfer gate electrode (not specifically illustrated) may be provided.

Referring generally to FIGS. 2A-2E and according to an embodiment of the present disclosure, each of the transfer gate electrodes 605 may be independently controlled by a respective control signal that is provided by a control circuitry located outside the array of pixels 900. In other words, the transfer gate electrodes 605 may be independently operated to perform multiple operations or functions, which may, or may not, be related to each other or among one another. Further, the operations performed by the plurality of transfer gate electrodes 605 may be sequentially performed or simultaneously performed.

Each of the control gate stack structures (614, 615) includes a respective layer stack of a gate dielectric 614 and a gate electrode 615 of other transistors in a sensing circuit, which may include a reset transistor 640, a source follower transistor 650, a select transistor 660, and other suitable transistors that may be used to amplify the signal generated by the photodetector of the subpixel.

Various active regions (608, 612) having a doping of the second conductivity type may be formed. According to an embodiment of the present disclosure, the various active regions (608, 612) may include a plurality of floating diffusion regions 608 that may function as the drain regions of the transfer transistor 630. For example, the floating diffusion regions 608 may include a first floating diffusion region 608A and a second floating diffusion region 608B. If three or more floating diffusion regions 608 are provided, the floating diffusion regions 608 may include a third floating diffusion region 608C (see e.g., FIG. 2E). If four or more floating diffusion regions 608 are provided, the floating diffusion regions 608 may include at least one additional floating diffusion region (not expressly shown).

Current flow between the second-conductivity-type pinned photodiode layer 602 and each of the plurality of floating diffusion regions 608 may be controlled by a respective one of the plurality of transfer gate electrodes 605. Since the transfer gate electrodes 605 may be independently controlled by different signals, the current flow between the second-conductivity-type pinned photodiode layer 602 and each of the plurality of floating diffusion regions 608 may be independently controlled so that each of the floating diffusion regions 608 may perform different functions and may be at different voltages. The plurality of floating diffusion regions 608 do not contact one another or each other, and may be electrically isolated from one another under suitable bias conditions for the transfer gate electrodes 605.

In an illustrative example, the first transfer gate electrode 605A may control the current flow between the second-conductivity-type pinned photodiode layer 602 and the first floating diffusion region 608A, the second transfer gate electrode 605B may control the current flow between the second-conductivity-type pinned photodiode layer 602 and the second floating diffusion region 608B, and the third transfer gate electrode 605C may control the current flow between the second-conductivity-type pinned photodiode layer 602 and the third floating diffusion region 608C.

The second-conductivity-type pinned photodiode layer 602 accumulates electrical charges (such as electrons in embodiments in which the second conductivity type is n-type) during sensing (i.e., while the subpixel actively detects the photons impinging thereupon, for example, for the purpose of taking a frame or a photo) functions as the source region of the transfer transistor 630. The active regions 612 include source regions and drain regions of the various transistors (640, 650, 660) in the sensing circuit. The floating diffusion regions 608 may be vertically spaced from the buried second-conductivity-type pinned photodiode layer 606 by the transfer transistor body region 611.

The floating diffusion regions 608 and the active regions 612 may be formed by ion implantation of dopants of the second conductivity type using masked ion implantation processes. The combination of a respective patterned photoresist layer and the gate stack structures (614, 605, 615) may be used ion implantation blocking structures (i.e., masking structures) during the ion implantation processes. The depth of the bottom surface of the floating diffusion regions 608 may be in a range from 100 nm to 400 nm, such as from 150 nm to 250 nm, although lesser and greater depths may also be used. The depth of the bottom surfaces of the active regions 612 may be in a range from 100 nm to 600 nm, such as from 150 nm to 400 nm, although lesser and greater depths may also be used.

A first-conductivity-type pinning layer 603 may be formed directly on top of the second-conductivity-type pinned photodiode layer 602 by ion implantation of dopants of the first conductivity type. The first-conductivity-type pinning layer 603 suppresses depletion of the interface between the second-conductivity-type pinned photodiode layer 602 and the first-conductivity-type pinning layer 603, and electrically stabilizes the second-conductivity-type pinned photodiode layer 602. The first-conductivity-type pinning layer 603 is omitted in all of the top-down views of the various exemplary structures of the present disclosure in order to clearly illustrate the lateral extent of the second-conductivity-type pinned photodiode layer 602 that underlies the first-conductivity-type pinning layer 603. The depth of the p-n junction between the first-conductivity-type pinning layer 603 and the second-conductivity-type pinned photodiode layer 602 may be in a range from 5 nm to 100 nm, although lesser and greater depths may also be used. The first-conductivity-type pinning layer 603 forming an additional p-n junction with the second-conductivity-type pinned photodiode layer 602 in addition to the p-n junction between the second-conductivity-type pinned photodiode layer 602 and the substrate semiconductor layer 601.

Interconnect-level dielectric layers 670 may be formed over the front surface 609 of the semiconductor substrate 500, and metal interconnect structures 680 connecting the various nodes of the transistors (630, 640, 650, 660) may be formed within each subpixel. The interconnect-level dielectric layers 670 may include a respective dielectric material such as undoped silicate glass, a doped silicate glass, organosilicate glass, a porous dielectric material, or combinations thereof. Dielectric liners including various dielectric materials (such as silicon nitride, silicon oxynitride, silicon oxide carbide, and/or dielectric metal oxides) may be optionally used in the interconnect-level dielectric layers 670. The metal interconnect structures 680 may include various metal via structures 682 and various metal line structures 684. For example, each of the floating diffusion regions 608 may be connected to the gate electrode 615 of a respective source follower transistor 650 by a subset of the metal interconnect structures 680. A photodetector may comprise a transfer transistor 630, and may be connected to a sense circuit including additional transistors (640, 650, 660).

The sensing circuit (640, 650, 660) includes at least two interconnected sets of a reset transistor 640, a source follower transistor 650, and a select transistor 660. Generally, the control signals for the gate electrodes 615 of the transistors in different interconnected sets of transistors (640, 650, 660) may be independent, although circuit modifications are possible in which gate electrodes 615 within different interconnected sets of transistors (640, 650, 660) share a same control signal or a complementary set of signals (i.e., one being the opposite of the other).

The plurality of floating diffusion regions 608 may be laterally spaced apart from each other by the second-conductivity-type pinned photodiode layer 602 (as illustrated in FIGS. 2A, 2C, and 2D), or by a shallow trench isolation structure 620 as illustrated in FIG. 2E. The layout of the transfer gate stack structures (614T, 605), the floating diffusion regions 608, and the interconnected sets of transistors (640, 650, 660) of the sensing circuit may have a rotational symmetry (as illustrated in FIGS. 2A and 2D), or may have a mirror symmetry around a vertical plane (as illustrated in FIG. 2C). Alternatively, there may not be any rotational symmetry or mirror symmetry in the layout of the unit cell UC as illustrated in FIG. 2E.

In one embodiment, the plurality of floating diffusion regions 608 may be provided at a respective corner of the second-conductivity-type pinned photodiode layer 602 (as illustrated in FIGS. 2A, 2C, and 2D). In one embodiment, the plurality of floating diffusion regions 608 may partially encircle the area of the second-conductivity-type pinned photodiode layer 602 with gaps thereamongst as illustrated in FIG. 2D.

Generally, the sensing circuit (640, 650, 660) of each subpixel may be provided within the area of the unit cell UC. In one embodiment, each interconnected sets of transistors (640, 650, 660) of the sensing circuit may be arranged side by side within an area of a respective strip located in proximity to an edge of the unit cell UC and extending along the entire length of a side of the unit cell UC or along at least 30% of the length of the side of the unit cell UC. In another embodiment, each interconnected sets of transistors (640, 650, 660) of the sensing circuit may be arranged around a respective floating diffusion region 608 of the transfer transistor 630 within an area of a block located in proximity to a corner of the unit cell UC.

The first exemplary structure includes at least one instance of the subpixel. The first exemplary structure may include an image sensor comprising an array of pixels located on the semiconductor substrate 500. The first exemplary structure may include a plurality of subpixels located within a respective pixel in the array of pixels. In one embodiment, each pixel within the array of pixels comprises a respective instance of the subpixel.

Figure 3A:
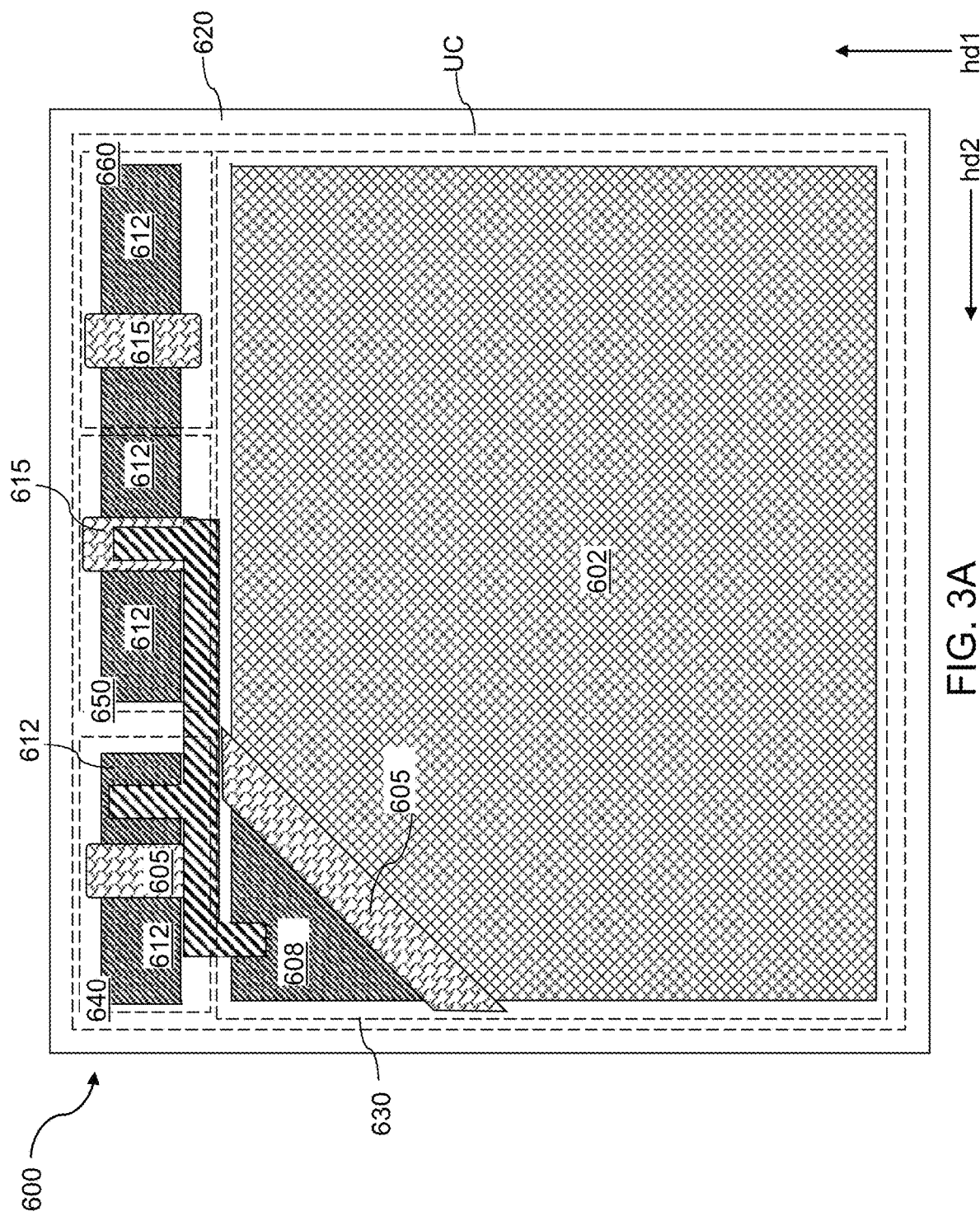
FIG. 3A is a plan view of front side sensor components within the area of a subpixel in a first configuration of a second exemplary structure according to an embodiment of the present disclosure.

Referring to FIG. 3A, a first configuration of a second exemplary structure is illustrated, which may be derived from the first exemplary structure by providing a single transfer gate stack structure (614T, 605) in lieu of a plurality of transfer gate stack structures (614T, 605), and by providing a single floating diffusion region 608 in lieu of a plurality of floating diffusion regions 608. Accordingly, a single interconnected set of transistors (640, 650, 660) may be used for the sensing circuit of the second exemplary structure.

The first configuration of the second exemplary structure can include a second-conductivity-type pinned photodiode layer 602 that forms at least one p-n junction with the substrate semiconductor layer 601. The first configuration of the second exemplary structure can include a floating diffusion region 608 that is laterally spaced from the second-conductivity-type pinned photodiode layer 602. A transfer gate stack structure (614T, 605) including a transfer gate dielectric 614T and a transfer gate electrode 605 may be located between the at least one second-conductivity-type pinned photodiode layer 602 and the floating diffusion region 608. While the transfer gate dielectric 614T is not expressly illustrated in FIG. 3A, it is understood that the transfer gate dielectric 614T has the same horizontal cross-sectional shape as the transfer gate electrode 605 in each configuration. The transfer gate stack structure (614T, 605) is located between the floating diffusion region 608 and each of the at least one second-conductivity-type pinned photodiode layer 602. In one embodiment, the gate length of the transfer gate stack structure (614T, 605), i.e., the width of the transfer gate stack structure (614T, 605) along the horizontal direction connecting each second-conductivity-type pinned photodiode layer 602 and the floating diffusion region 608, may be uniform throughout.

Figure 3B:
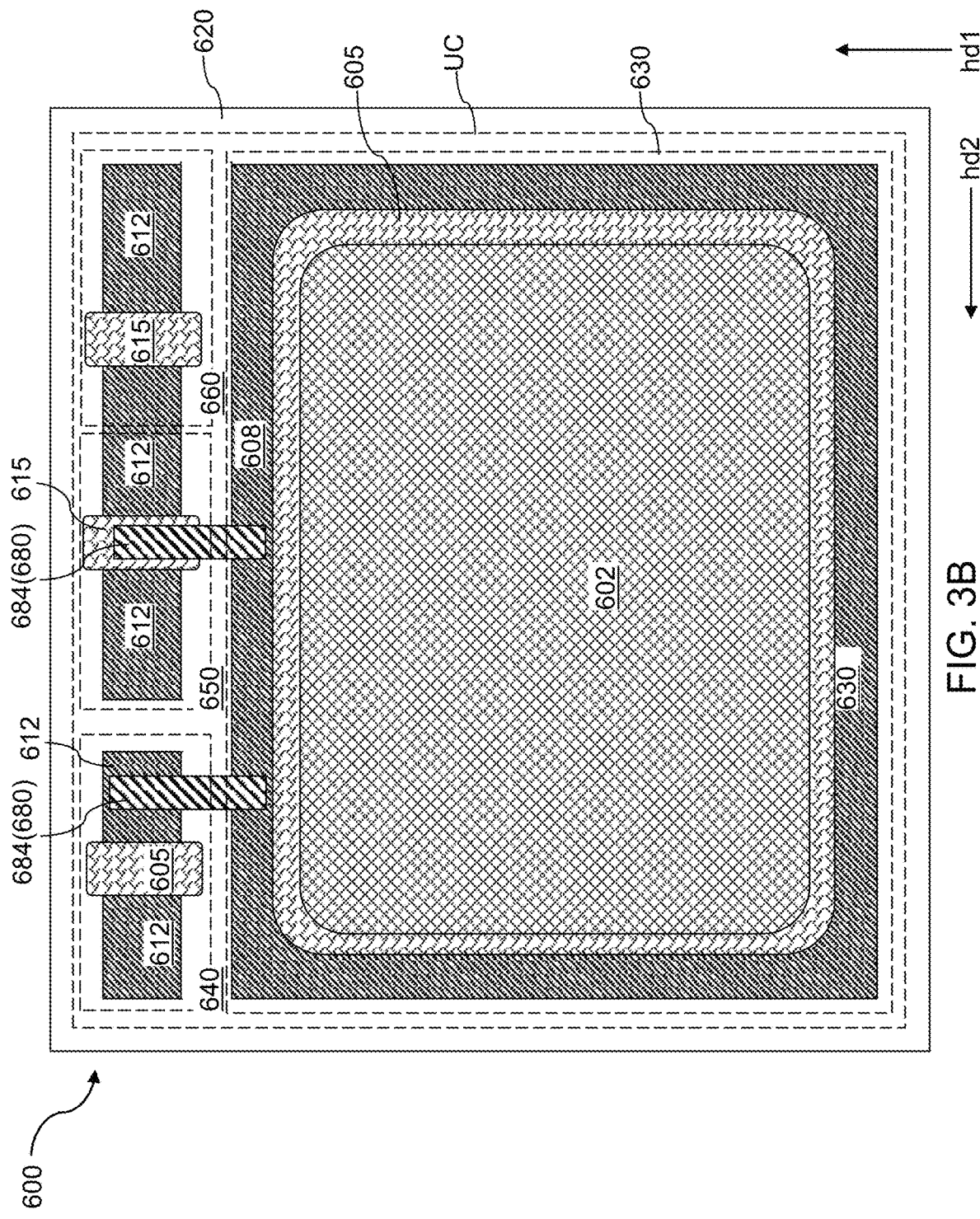
FIG. 3B is a plan view of front side sensor components within the area of a subpixel in a second configuration of the second exemplary structure according to an embodiment of the present disclosure.
Figure 3C:
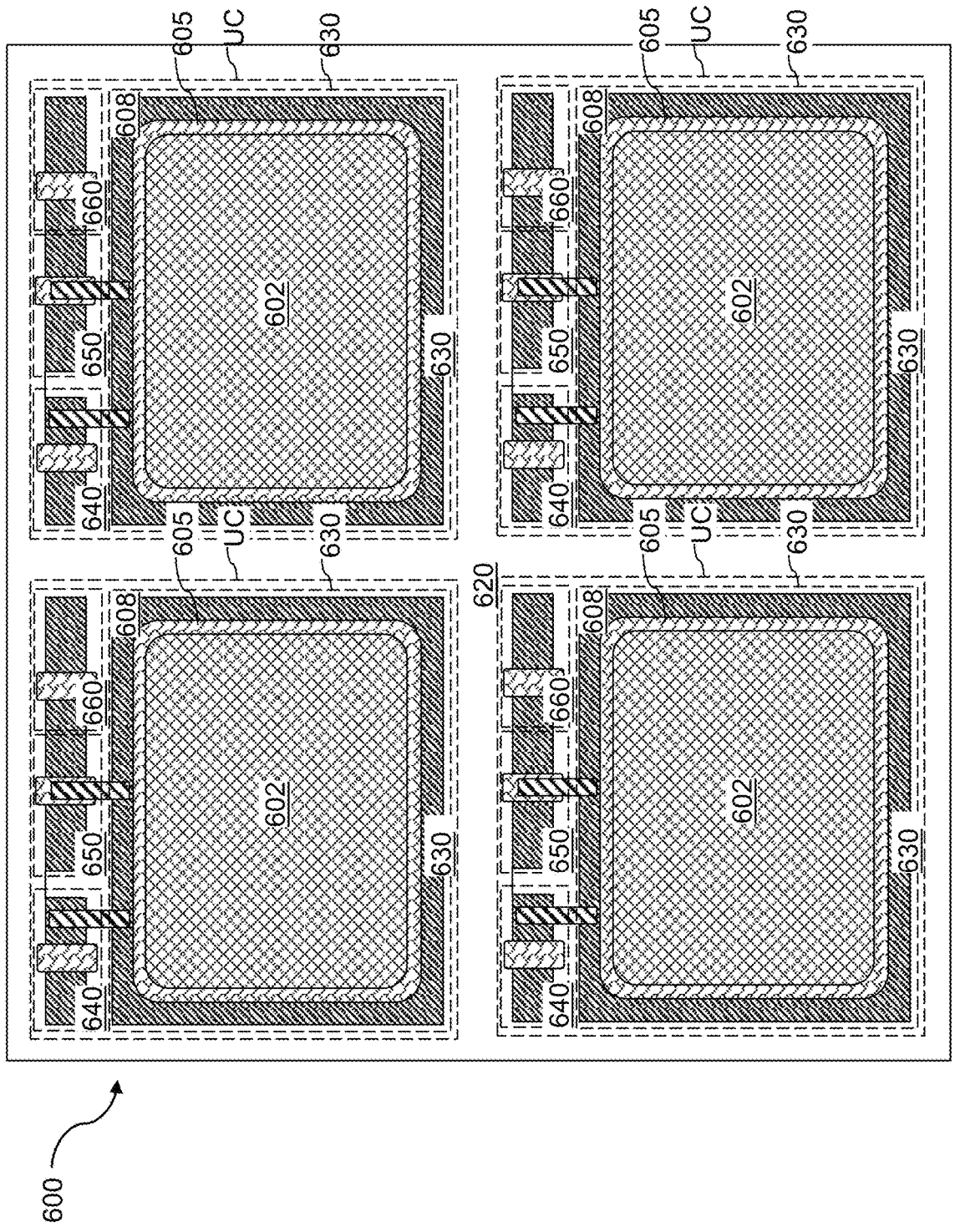
FIG. 3C is a zoom-out plan view of the second configuration of the second exemplary structure of FIG. 3B.

Referring to FIGS. 3B and 3C, a second configuration of the second exemplary structure can be derived from the first configuration of the first exemplary structure of FIG. 3A by forming the transfer gate electrode 605 in an annular configuration such that the transfer gate electrode 605 surrounds the area of the second-conductivity-type pinned photodiode layer 602.

Figure 4:
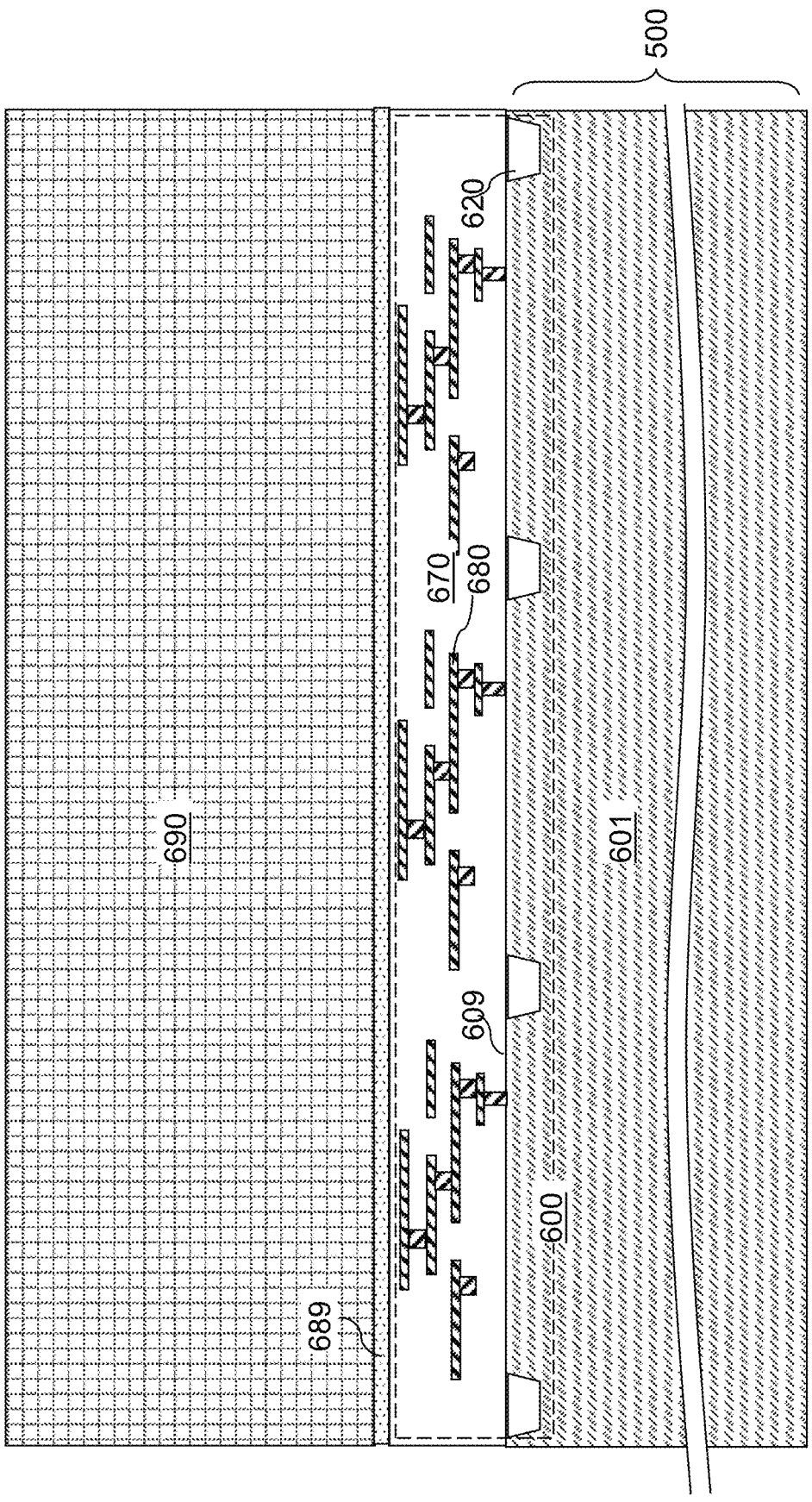
FIG. 4 is a vertical cross-sectional view of an exemplary structure after formation of metal interconnect structures formed within interconnection-level dielectric layers and attachment of a carrier substrate according to an embodiment of the present disclosure.

Referring to FIG. 4, additional interconnect-level dielectric layers 670 and additional metal interconnect structures 680 may be formed on the front side of the semiconductor substrate 500. The front side of the assembly of the semiconductor substrate 500, the interconnect-level dielectric layers 670, and the structures formed therein may be bonded to a carrier substrate 690. The carrier substrate 690 is temporarily attached to the assembly of the semiconductor substrate 500 and the interconnect-level dielectric layers 670 to provide subsequent thinning of the semiconductor substrate 500, and to provide subsequent handling of the assembly of a thinned semiconductor substrate 500 and the interconnect-level dielectric layers 670. The carrier substrate 690 may include a semiconductor material, an insulating material, or a metallic material, and may have a thickness in a range from 300 microns to 1 mm, although lesser and greater thicknesses may also be used.

Any suitable bonding method may be used to bond the carrier substrate 690 to the front side of the interconnect-level dielectric layers 670. Exemplary bonding methods that may be used to bond the carrier substrate 690 to the interconnect-level dielectric layers 670 include, but are not limited to, oxide-to-oxide bonding, oxide-to-semiconductor bonding, fusion bonding, hybrid bonding, anodic bonding, direct bonding, other suitable bonding processes, and/or combinations thereof. Optionally, a bonding buffer layer 689 including an intermediate bonding material (e.g., silicon oxide, silicon nitride, or a semiconductor material) may be used to provide bonding between the interconnection-level dielectric layers 670 and the carrier substrate 690.

Figure 5:
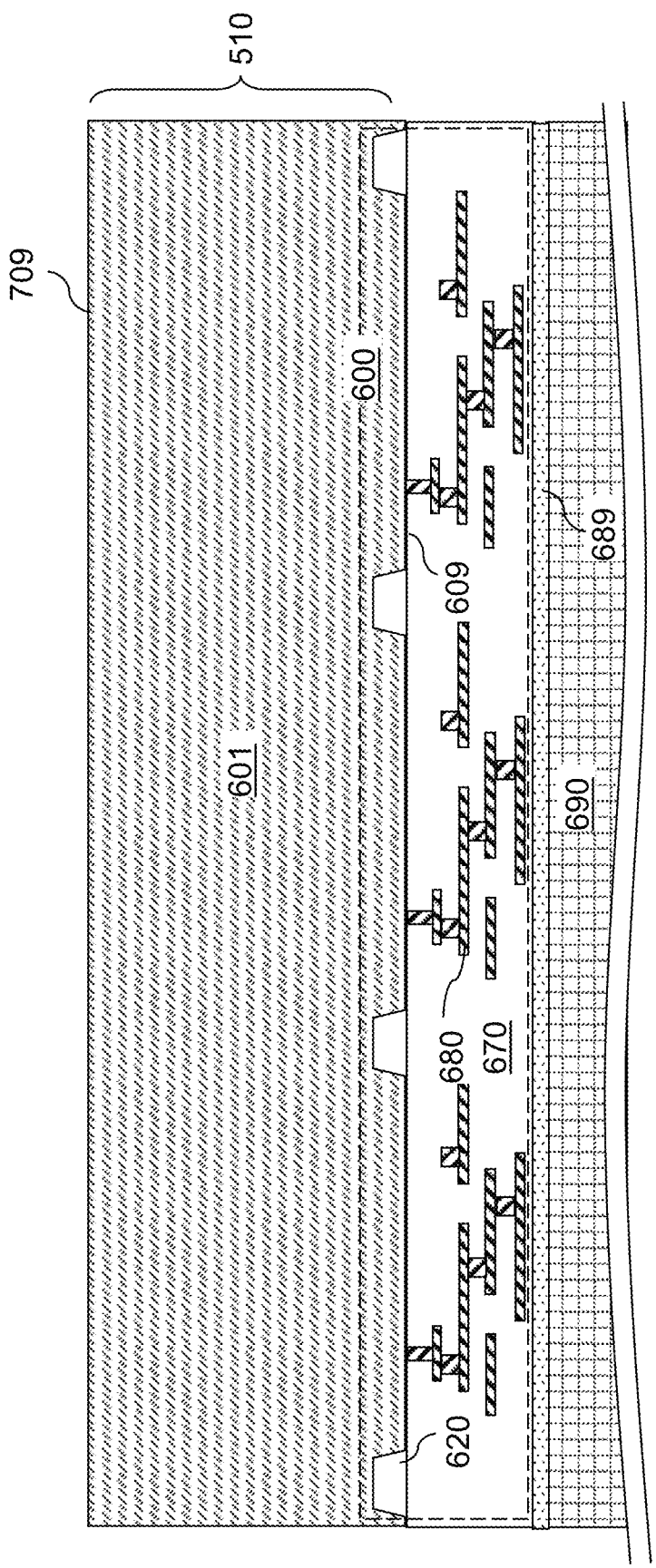
FIG. 5 is a vertical cross-sectional view of the exemplary structure after thinning a semiconductor substrate according to an embodiment of the present disclosure.

Referring to FIG. 5, the backside of the semiconductor substrate 500 may be thinned, for example, by grinding, polishing, an isotropic etch process, and/or an anisotropic etch process. The carrier substrate 690 may provide mechanical support to the semiconductor substrate 500 during the thinning process. In one embodiment, the semiconductor substrate 500 may be thinned to a thickness in a range from 1 micron to 12 microns, such as from 1.5 microns to 8 microns, although lesser and greater thicknesses may also be employed. The semiconductor substrate 500 as thinned after the thinning process is herein referred to as a thinned semiconductor substrate 510, or as a semiconductor substrate 510. The thickness of the thinned semiconductor substrate 510 may be determined by the maximum depth of deep trenches to be subsequently formed on the backside of the thinned semiconductor substrate 510. In one embodiment, the thickness of the thinned semiconductor substrate 510 may be selected such that deep trenches to be subsequently formed on the backside of the semiconductor substrate 510 reaches proximal surfaces of the shallow trench isolation structures 620. The backside surface 709 of the thinned semiconductor substrate 510 may be polished to provide a planar horizontal surface that is parallel to the front surface 609 of the thinned semiconductor substrate 510. The exemplary structure may be subsequently flipped upside down for further processing.

Figure 6:
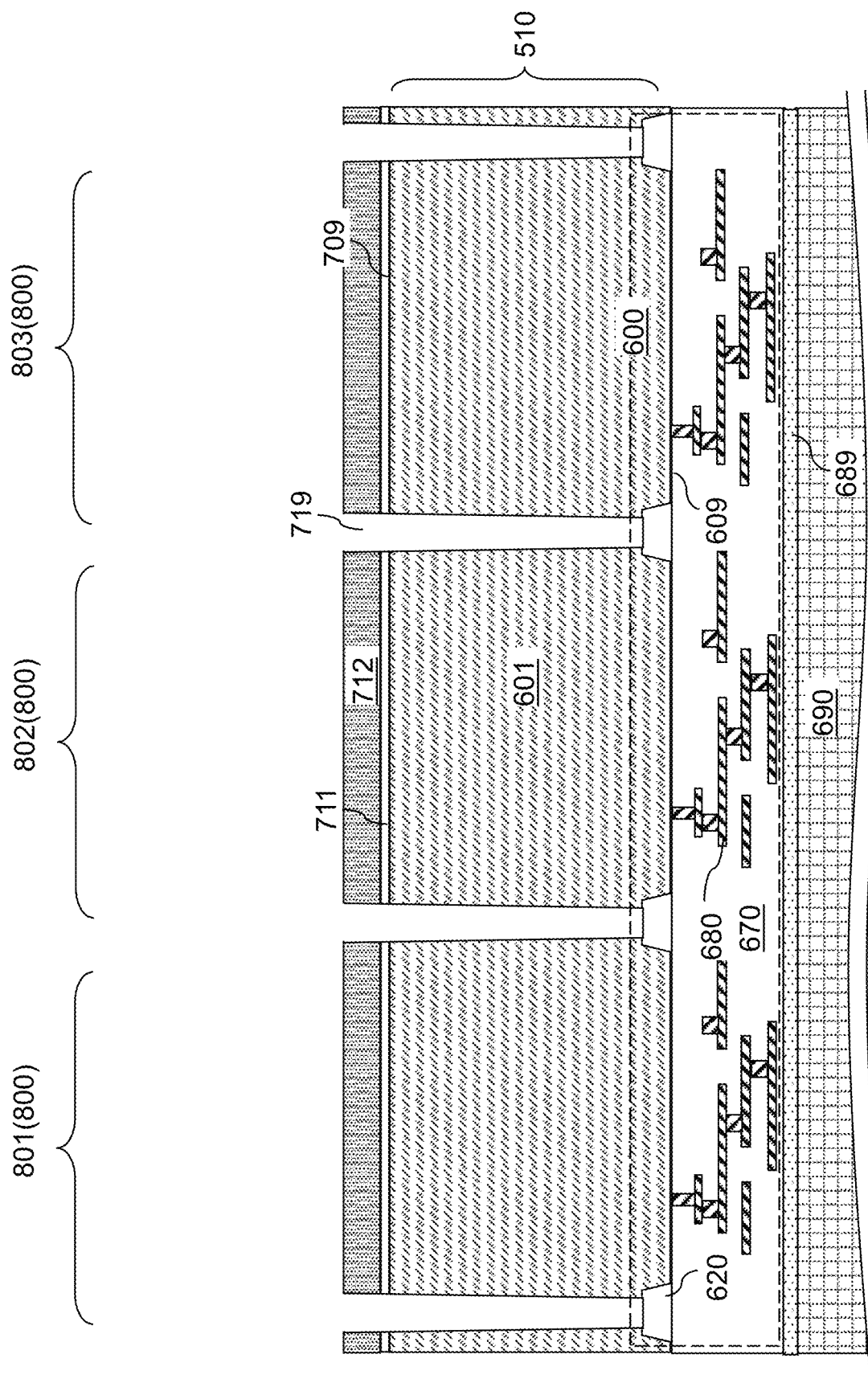
FIG. 6 is a vertical cross-sectional view of the exemplary structure after formation of deep trenches on the backside of the semiconductor substrate according to an embodiment of the present disclosure.

Referring to FIG. 6, an optional pad dielectric layer 711 and a hard mask layer 712 may be formed over the backside surface 709 of the semiconductor substrate 510. The optional pad dielectric layer 711, if present, may include a silicon oxide layer, and may have a thickness in a range from 5 nm to 50 nm, although lesser and greater thicknesses can also be employed. The hard mask layer 712 includes an etch mask material that may be subsequently removed selective to the pad dielectric layer 711 and/or selective to the semiconductor substrate 510. For example, the hard mask layer 712 may include silicon nitride, borosilicate glass, or a metallic material. The hard mask layer 712 may have a thickness in a range from 50 nm to 800 nm, although lesser and greater thicknesses may also be used.

A photoresist layer (not shown) may be applied over the hard mask layer 712, and may be lithographically patterned to form openings that generally replicate the pattern of the shallow trench isolation structures 620 located underneath. A first etch process may be performed to transfer the pattern in the photoresist layer through the hard mask layer 712 and the optional pad dielectric layer 711. Unmasked portions of the semiconductor substrate 510 may be etched by performing a second anisotropic etch process, which transfers the pattern of the openings in the photoresist layer and the hard mask layer 712 through the semiconductor substrate 510. The depth of the deep trenches 719 may be in a range from 1 micron to 10 microns, such as from 1.5 microns to 8 microns. The photoresist layer may be completely consumed during the second anisotropic etch process. Deep trenches 719 may be formed through the semiconductor substrate 510.

The deep trenches 719 may define areas for subpixels 800. Each subpixel 800 may be located within a respective subpixel region, which is located within a region of a pixel, i.e., within a pixel region. For example, an area of a pixel may include an area of a first subpixel 801 (800), an area of a second subpixel 802 (800), and an area of a third subpixel 803 (800). In an illustrative example, the first subpixel 801 may be formed in a region that includes a photodetector configured to detect green light, the second subpixel 802 may be formed in a region that includes a photodetector configured to detect red light, and the third subpixel 803 may be formed in a region that includes a photodetector configured to detect blue light. Each subpixel 800 may include a volume containing a patterned columnar portion of the semiconductor substrate 510 that is laterally enclosed by a connected set of deep trenches 719. A pixel region of a pixel includes all subpixel regions for the set of subpixels 800 contained within the pixel.

Figure 7:
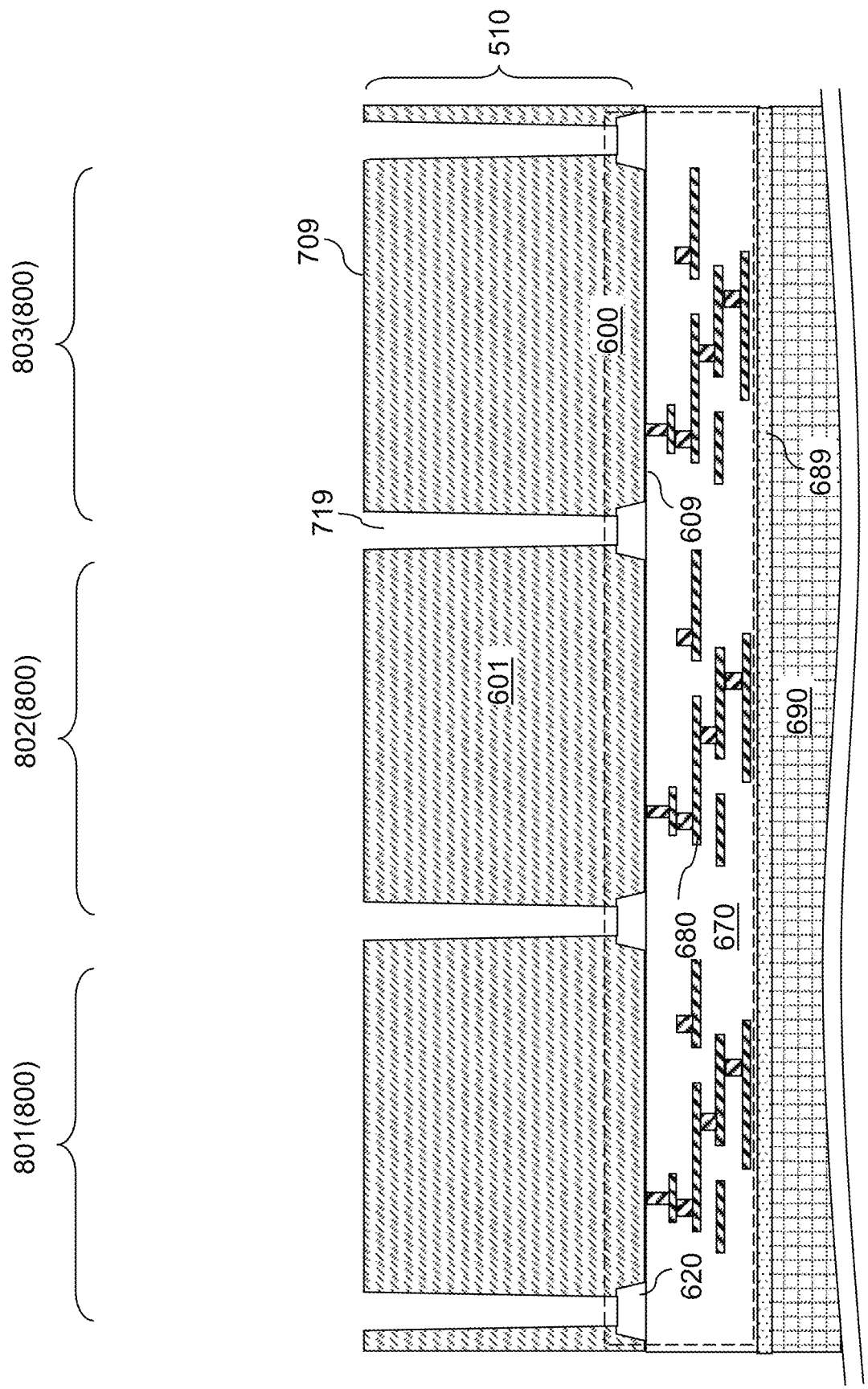
FIG. 7 is a vertical cross-sectional view of the exemplary structure after removal of a hard mask layer and a pad dielectric layer according to an embodiment of the present disclosure.

Referring to FIG. 7, the hard mask layer 712 may be removed selective to the semiconductor substrate 510, the pad dielectric layer 711, and the shallow trench isolation structures 620. In an illustrative example, if the hard mask layer 712 includes silicon nitride, a wet etch process using hot phosphoric acid may be performed to remove the hard mask layer 712. Subsequently, the pad dielectric layer 711 may be removed selective to the semiconductor substrate 510.

Figure 8:
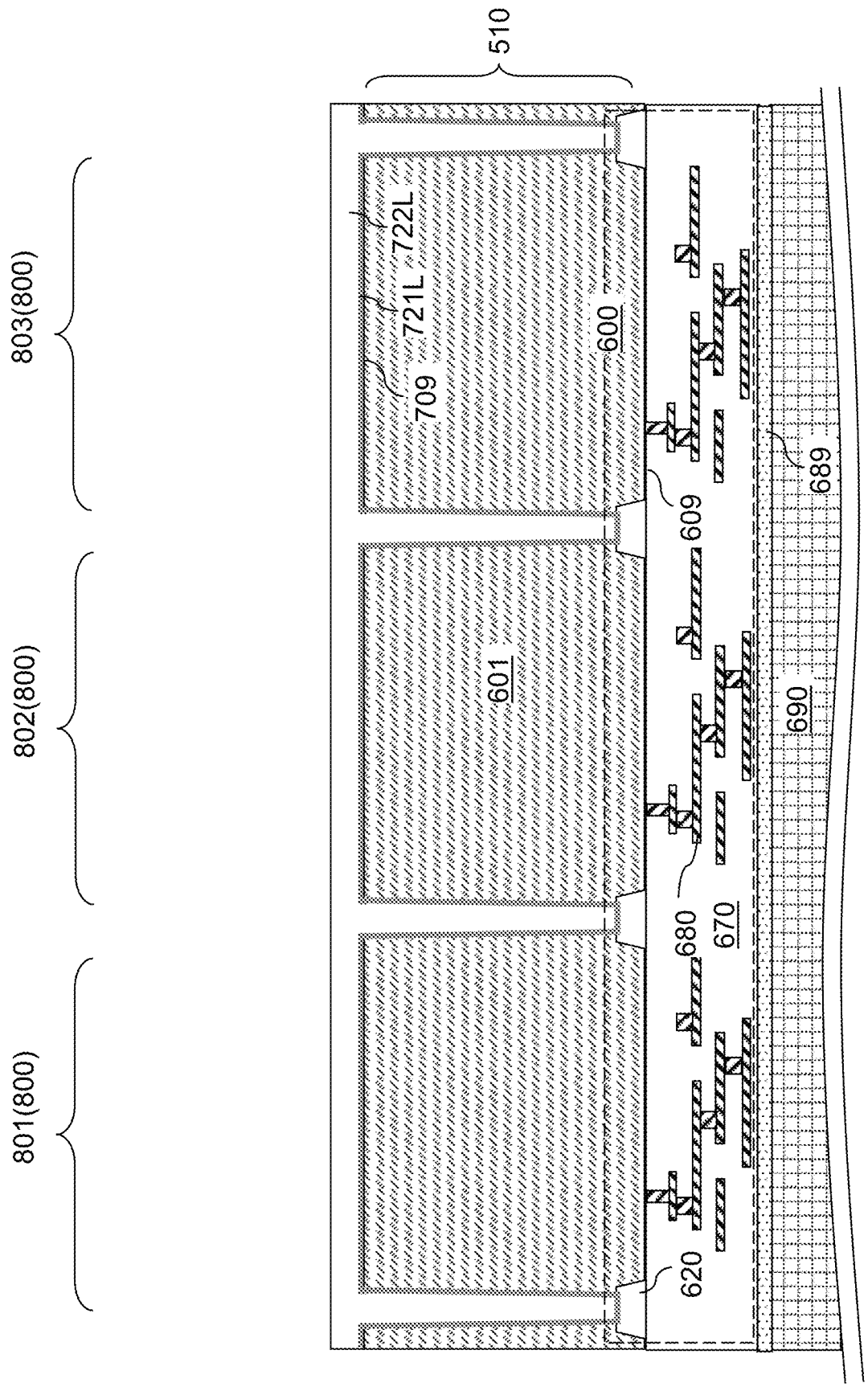
FIG. 8 is a vertical cross-sectional view of the exemplary structure after formation of a dielectric metal oxide liner and a dielectric isolation layer according to an embodiment of the present disclosure.

Referring to FIG. 8, a dielectric metal oxide liner 721L may be conformally deposited over the physically exposed surfaces of the semiconductor substrate 510. The dielectric metal oxide liner 721L may be formed on the sidewalls of the deep trenches 719, on the backside surface 709 of the semiconductor substrate 510, and on surfaces of the shallow trench isolation structures 620 in embodiments in which the shallow trench isolation structures 620 are physically exposed to the deep trenches 719. The dielectric metal oxide liner 721L includes a dielectric metal oxide material having a dielectric constant greater than 7.9 (i.e., a "high-k" dielectric material). Exemplary dielectric metal oxide materials that may be used for the dielectric metal oxide liner 721L include hafnium oxide, aluminum oxide, zirconium oxide, magnesium oxide, calcium oxide, yttrium oxide, tantalum oxide, strontium oxide, titanium oxide, lanthanum oxide, barium oxide or combinations thereof. Other suitable materials are within the contemplated scope of disclosure. The dielectric metal oxide liner 721L may be deposited using a chemical vapor deposition process or an atomic layer deposition (ALD). The thickness of the dielectric metal oxide liner 721L may be in a range from 2 nm to 6 nm, although lesser and greater thicknesses may also be used.

The dielectric metal oxide liner 721L may be formed to provide negative charge trapping. For example, the dielectric metal oxide liner 721L may be deposited with a non-stoichiometric oxygen-rich composition, or may be surface-treated, for example, with plasma, to have a non-stoichiometric oxygen-rich surface compression. In such and embodiment, the dielectric metal oxide liner 721L may include an oxygen-rich dielectric metal oxide material with negatively charged interstitial oxygen atoms and/or dangling or broken metal oxide bonds, thereby providing accumulation of negative charges within the dielectric metal oxide liner 721L. In an illustrative example, the areal density of accumulated negative charges within the dielectric metal oxide liner 721 may be in a range from $5.0 \times 10^9$ electrons per $cm^2$ to $1.0 \times 10^{14}$ electrons per $cm^2$, such as from $1.0 \times 10^{10}$ electrons per $cm^2$ to $2.0 \times 10^{13}$ electrons per $cm^2$. The dielectric metal oxide material used in the dielectric metal oxide liner 721L may accumulate more negative charges than other dielectric materials such as silicon nitride or silicon oxide. The negative charge in the dielectric metal oxide liner 721L increases hole accumulation within interfacial portions of the first-conductivity-type wells 607 and the substrate semiconductor layer 601 of the semiconductor substrate 510. A depletion region may be formed within portions of the first-conductivity-type wells 607 and the substrate semiconductor layer 601 of the semiconductor substrate 510 that are proximal to the dielectric metal oxide liner 721L. The depletion region reduces dark current and/or white pixels for the image sensor.

A dielectric isolation layer 722L may be formed by conformally depositing a dielectric material in remaining volumes of the deep trenches 719. The dielectric isolation layer 722L includes a dielectric material such as undoped silicate glass, a doped silicate glass (such as borosilicate glass), or a combination thereof. The combination of the dielectric metal oxide liner 721L and the dielectric isolation layer 722L may fill the deep trenches 719 (with or without seams and/or encapsulated cavities).

Figure 9:
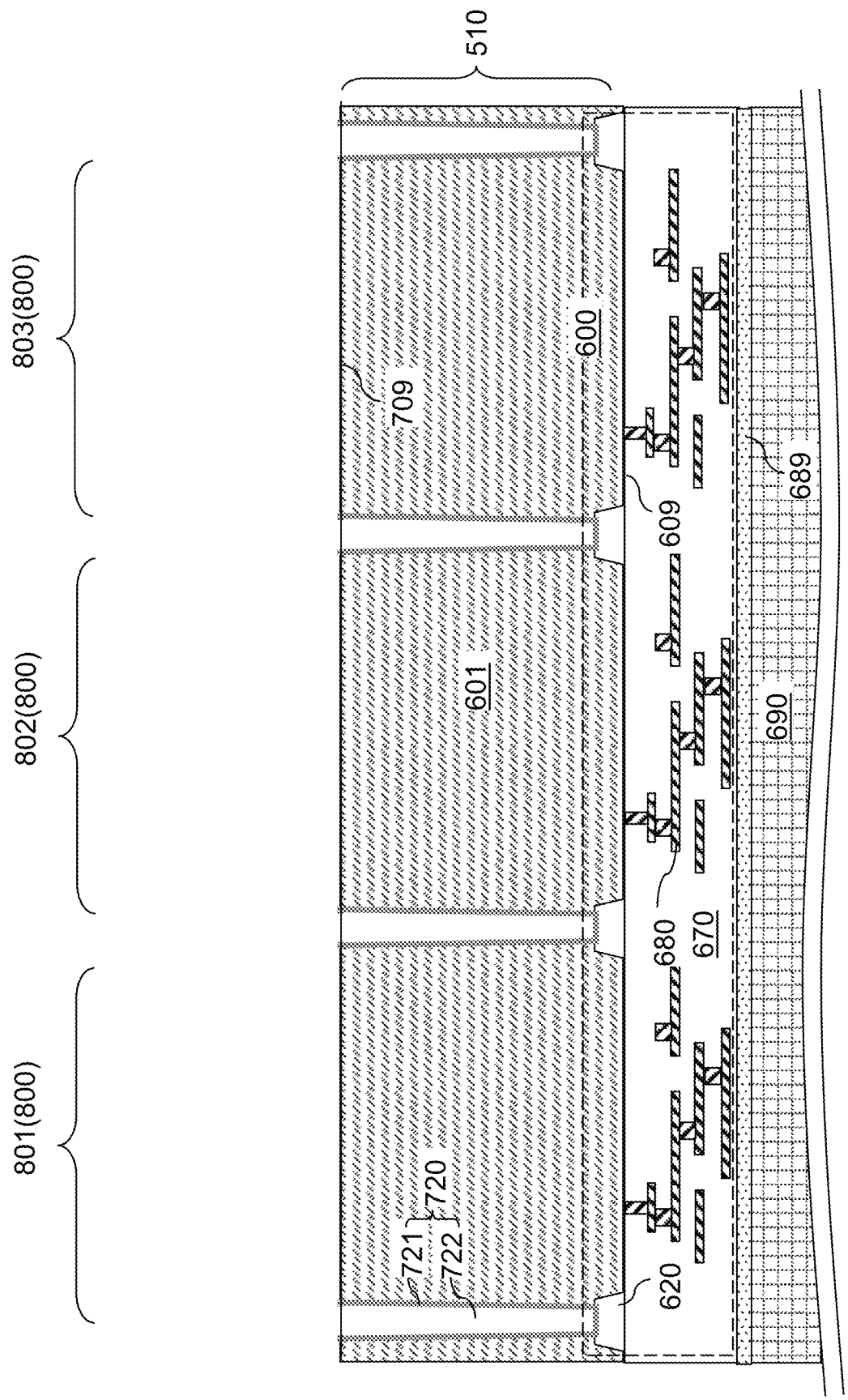
FIG. 9 is a vertical cross-sectional view of the exemplary structure after formation of deep trench isolation structures according to an embodiment of the present disclosure.

Referring to FIG. 9, horizontal portions of the dielectric isolation layer 722L and the dielectric metal oxide liner 721L may be removed from above the backside surface 709 of the semiconductor substrate 510 by a planarization process. A recess etch and/or a chemical mechanical planarization process may be used to remove the horizontal portions of the dielectric isolation layer 722L and the dielectric metal oxide liner 721L. In one embodiment, the resulting dielectric metal oxide liner 721 may be used as an etch stop layer during a recess etch process that removes the horizontal portions of the resulting dielectric isolation layer 722, or as a stopping layer during a chemical mechanical planarization process that removes the horizontal portions of the dielectric isolation layer 722. The horizontal portions of the dielectric metal oxide liner 721 that overlies the backside surface 709 of the semiconductor substrate 510 may be subsequently removed by performing an isotropic etch process (such as a wet etch process) that etches the material of the dielectric metal oxide liner 721 selective to the semiconductor material of the semiconductor substrate 510. Remaining vertically-extending portions of the dielectric metal oxide liner 721 and the dielectric isolation layer 722 fill the deep trenches 719, and are herein referred to as deep trench isolation structures 720.

Figure 10:
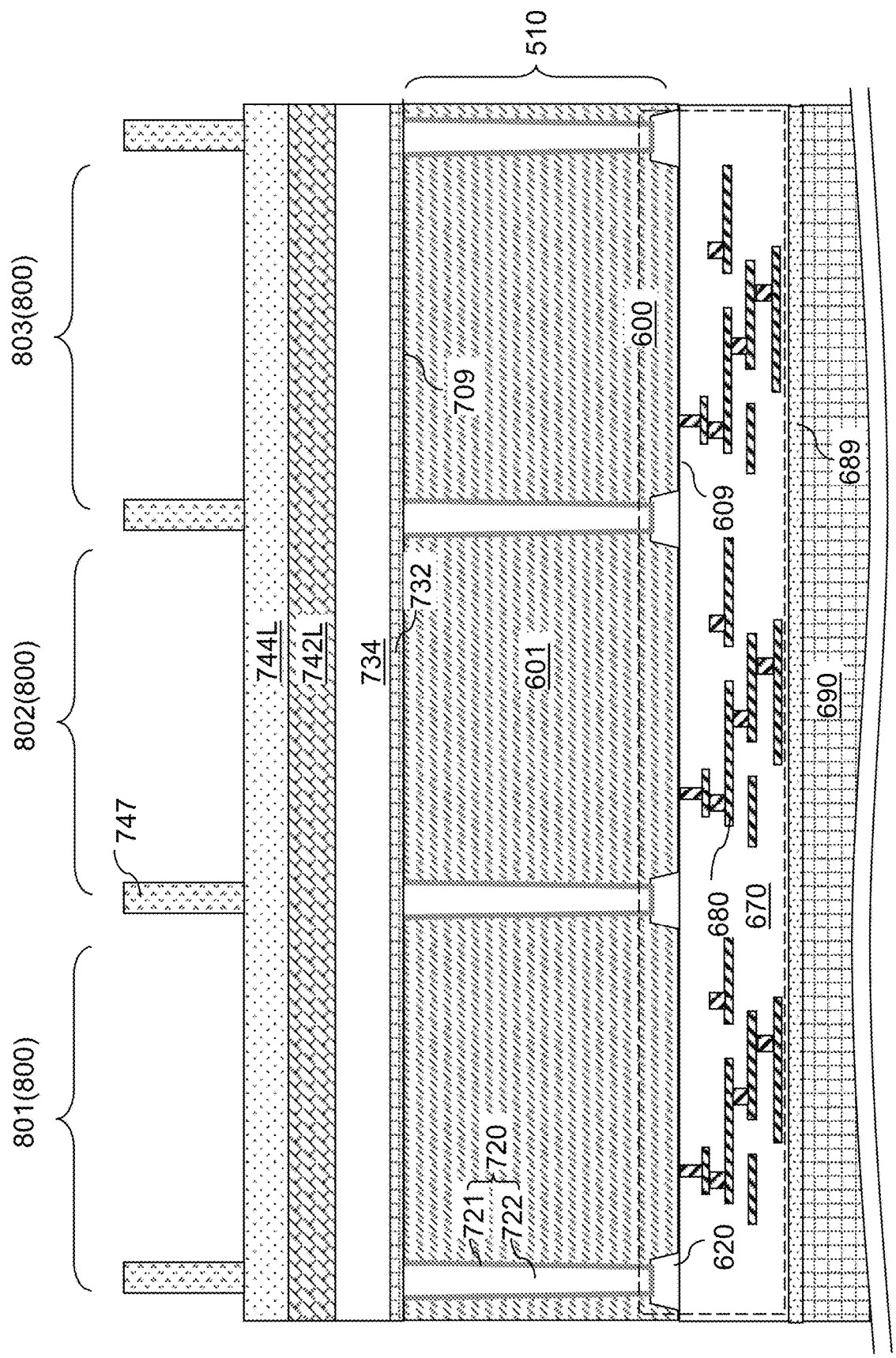
FIG. 10 is a vertical cross-sectional view of the exemplary structure after formation of an antireflective coating (ARC) layer, an optical refraction layer, a dielectric grid material layer, a metallic reflective material layer, and a patterned photoresist layer according to an embodiment of the present disclosure.

Referring to FIG. 10, an optional antireflective coating (ARC) layer 732, an optical buffer layer 734, a dielectric grid material layer 742L, and a metallic reflective material layer 744L may be sequentially deposited over the backside surface 709 of the semiconductor substrate 510.

The optional ARC layer 732 includes an antireflective coating material that reduces reflection between the semiconductor material of the semiconductor substrate 510 and the overlying material layer, i.e., the optical buffer layer 734. The optional ARC layer 732, if present, may have a refractive index that is between the refractive index of the semiconductor material of the semiconductor substrate 510 and the refractive index of the optical buffer layer 734. The optional ARC layer 732 may include a single material layer or a layer stack of multiple layers having gradually changing refractive indices. The optional ARC layer 732 includes an optically transparent material, and may include a semiconductor material, an insulating material, a conductive material, and/or a polymer material. The ARC layer 732 may have a thickness in a range from 50 nm to 300 nm, although lesser and greater thicknesses may also be used.

The optical buffer layer 734 includes a semiconductor material (such as silicon, germanium, a silicon-germanium alloy, or a III-V compound semiconductor material) or a dielectric material (such as silicon oxide, silicon oxynitride, silicon nitride, or a dielectric metal oxide (e.g., aluminum oxide). The optical buffer layer 734 includes a material that is conducive to formation of trenches having a high aspect ratio during a subsequent anisotropic etch process. The optical buffer layer 734 may be formed as an unpatterned (blanket) material layer having two horizontal planar surfaces that are parallel to the backside surface 709 of the semiconductor substrate 510. The distal surface of the optical buffer layer 734 is one of the two horizontal planar surfaces of the optical buffer layer 734 that is more distal from the semiconductor substrate 510, i.e., a top surface of the optical buffer layer 734.

The dielectric grid material layer 742L may include a dielectric material such as silicon oxide, a porous dielectric material, polyimide, or another dielectric material. The thickness of the dielectric grid material layer may be in a range from 50 nm to 500 nm, although lesser and greater thicknesses may also be used. The metallic reflective material layer 744L may include a metallic material that may provide high reflectivity. For example, the metallic reflective material layer 744L may include silver, aluminum, copper, gold, or any other highly reflective metallic material. The thickness of the metallic reflective material layer 744L may be in a range from 50 nm to 500 nm, although lesser and greater thicknesses may also be used.

A photoresist layer 747 may be applied over the metallic reflective material layer 744L, and may be lithographically patterned to form openings within areas of the second-conductivity-type pinned photodiode layers 602, i.e., within the areas of the photodetectors that include a respective p-n junction between the second-conductivity-type pinned photodiode layers 602 and the first-conductivity-type wells 607. The areas of the transistors of the sensing circuit (such as the reset transistors 640, the source follower transistors 650, and the select transistors 660) may, or may not, be covered by the photoresist layer 747.

Figure 11A:
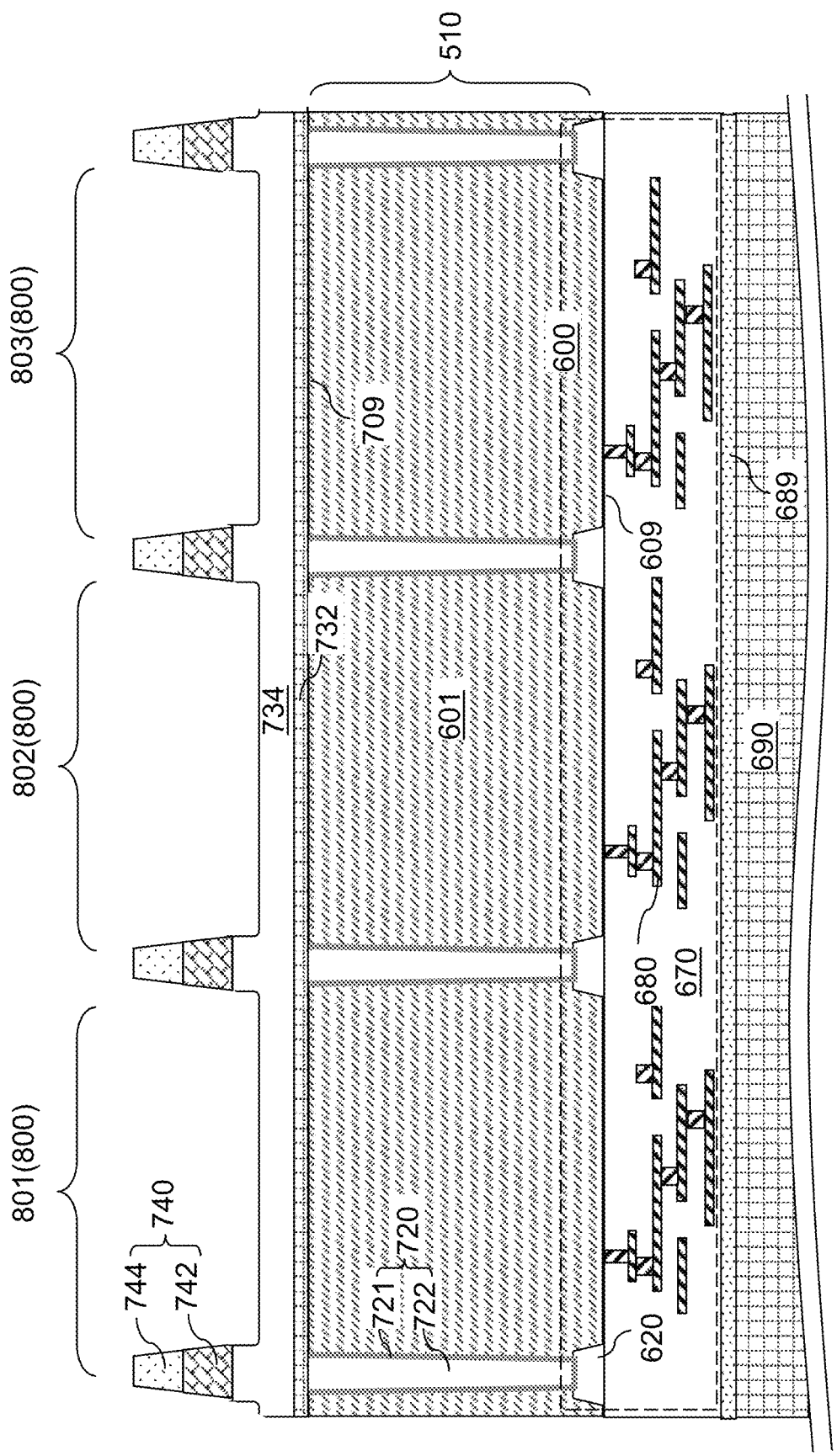
FIG. 11A is a vertical cross-sectional view of the exemplary structure after formation of a composite grid structure according to an embodiment of the present disclosure.
Figure 11B:
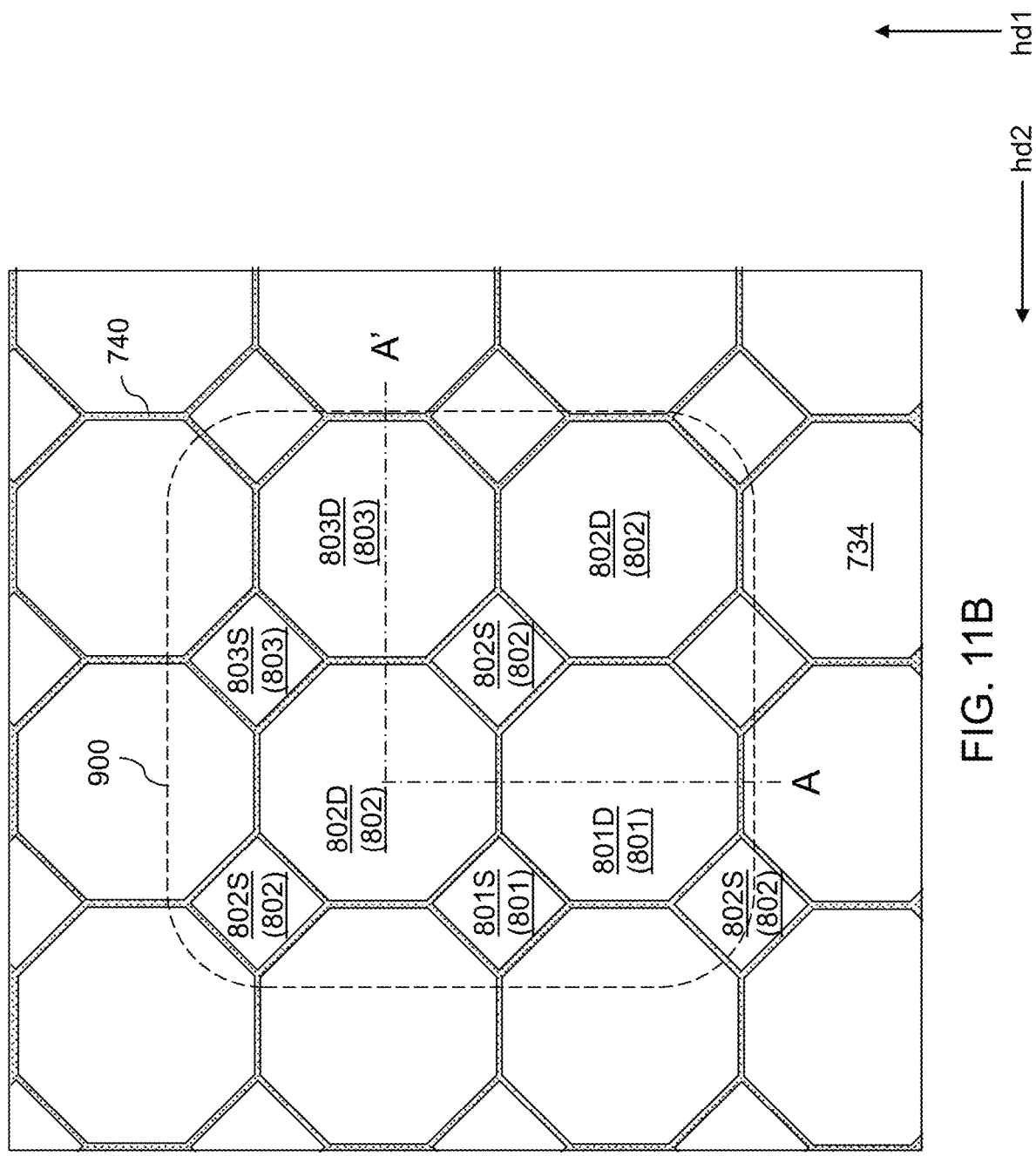
FIG. 11B is a plan view of the exemplary structure of FIG. 11A. The hinged vertical plane A-A' corresponds to the plane of the vertical cross-sectional view of FIG. 11A.

Referring to FIGS. 11A and 11B, portions of the dielectric grid material layer 742L and the metallic reflective material layer 744L that are not masked by the patterned portions of the photoresist layer 747 may be etched to form openings therethrough. Remaining portions of the dielectric grid material layer 742L form a dielectric grid structure 742, and remaining portions of the metallic reflective material layer 744L form a metallic grid structure 744. The stack of the dielectric grid structure 742 and the metallic grid structure 744 constitutes a grid structure 740, which is also referred to as a composite grid structure.

The grid structure 740 may overlie peripheries of the second-conductivity-type pinned photodiode layers 602, and define a light collection area for each photodetector located within a respective subpixel 800. A pixel 900 may include a set of subpixels configured to detect light at different wavelengths. Each pixel 900 may be located within a respective pixel region, which includes a set of subpixels 800. For example, a pixel 900 may include at least one instance of a first subpixel 801, at least one instance of a second subpixel 802, and at least one instance of a third subpixel 803. In the illustrated example, a pixel may include a first subpixel 801 (such as a green subpixel) located in a first subpixel region, two second subpixels 802 (such as two red subpixels) located in two second subpixel regions, and a third subpixel 803 (such as a blue subpixel) located in a third subpixel region. Generally, a pixel 900 may include various combinations of at least two types of subpixels 800 configured to detect light at different wavelength ranges. Alternatively, an image sensor may be a monochromatic image sensor including a single type of subpixels 800. In this embodiment, each pixel 900 may include only a single subpixel 800.

Generally, a grid structure 740 comprises at least a metallic grid structure 744 having reflective sidewalls. The grid structure 740 may comprise a composite grid structure including a vertical stack of a metallic grid structure 744 having reflective sidewalls and a dielectric grid structure 742. The grid structure 740 may be formed over the distal surface of the optical buffer layer 734. The grid structure 740 includes openings that overlie a respective one of the photodetectors comprising a transfer transistor 630. The portions of the distal surface of the optical buffer layer 734 that are contacted by the bottom surfaces of the grid structure are planar distal surface portions of the distal surface of the optical buffer layer 734. The portions of the distal surface of the optical buffer layer 734 that do not contact the grid structure 740 may be collaterally vertically recessed relative to the horizontal plane including the bottom surface of the grid structure during the anisotropic etch process that patterns the grid structure.

The grid structure 740 may divide each subpixel 800 into a detector region and a sensing circuit region. For example, a first subpixel 801 may include a first detector region 801D that overlies the second-conductivity-type pinned photodiode layer 602 of the first subpixel 801, and a first sensing circuit region 801S that overlies the sensing circuit (640, 650, 660) of the first subpixel 801. A second subpixel 802 may include a second detector region 802D that overlies the second-conductivity-type pinned photodiode layer 602 of the second subpixel 802, and a second sensing circuit region 802S that overlies the sensing circuit (640, 650, 660) of the second subpixel 802. A third subpixel 803 may include a third detector region 803D that overlies the second-conductivity-type pinned photodiode layer 602 of the third subpixel 803, and a third sensing circuit region 803S that overlies the sensing circuit (640, 650, 660) of the third subpixel 803. Generally, the set of all subpixels 800 within a pixel 900 may be arranged in any pattern that is conducive to periodic repetition of the pixels 900 within an array 1000 of pixels 900.

Figure 12:
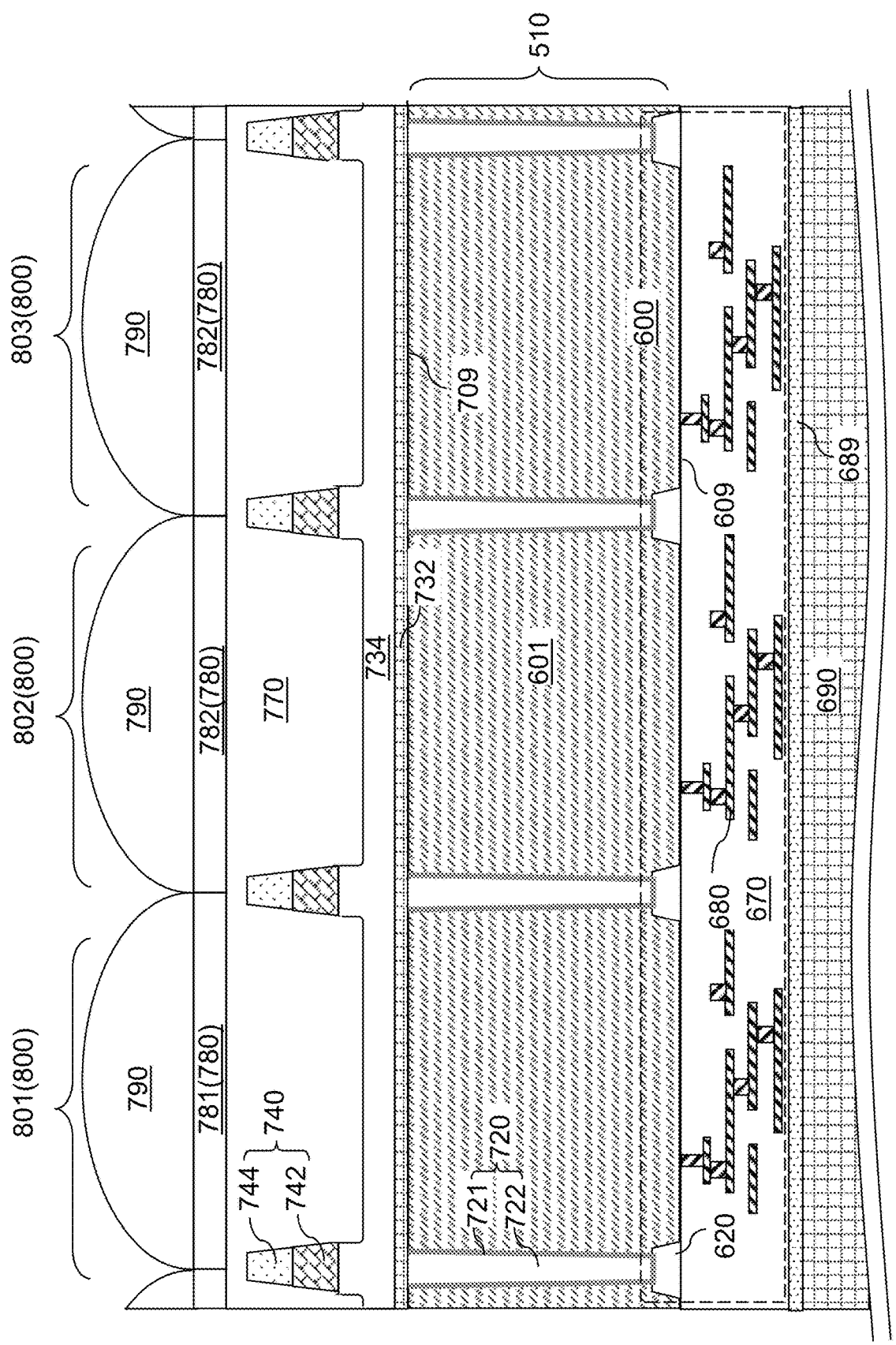
FIG. 12 is a vertical cross-sectional view of the exemplary structure after formation of an optically transparent layer, color filters, and lenses according to an embodiment of the present disclosure.

Referring to FIG. 12, an optically transparent layer 770 having a planar top surface may be formed over the grid structure 740. The optically transparent layer 770 may be formed by depositing a self-planarizing dielectric material such as flowable oxide (FOX). Alternatively, a transparent dielectric material may be deposited and planarized, for example, by chemical mechanical planarization to provide the optically transparent layer 770.

The optically transparent layer 770 vertically extends through the openings in the grid structure 740, and has a second refractive index that is different from the first refractive index. The optically transparent layer 770 is formed on the optical buffer layer 734.

Various color filtering materials may be applied over the optically transparent layer 770, and may be patterned to form various color filters 780. The color filters 780 may include first-type color filters 781 formed within the regions of the first subpixels 801, second-type color filters 782 formed within the regions of the second subpixels 802, and third-type color filters 783 formed within the regions of the third subpixels 803. The composition of each color filtering material may be selected such that light within a target wavelength ranges passes through the color filtering material, while light outside the target wavelength range is absorbed by the color filtering material.

Optical lenses 790 may be formed over the color filters 780 by applying an optically transparent material over the color filters 780 and by patterning the optically transparent material into material portions having convex surfaces that are centered on a respective one of the underlying openings within the grid structure 740.

Figure 13:
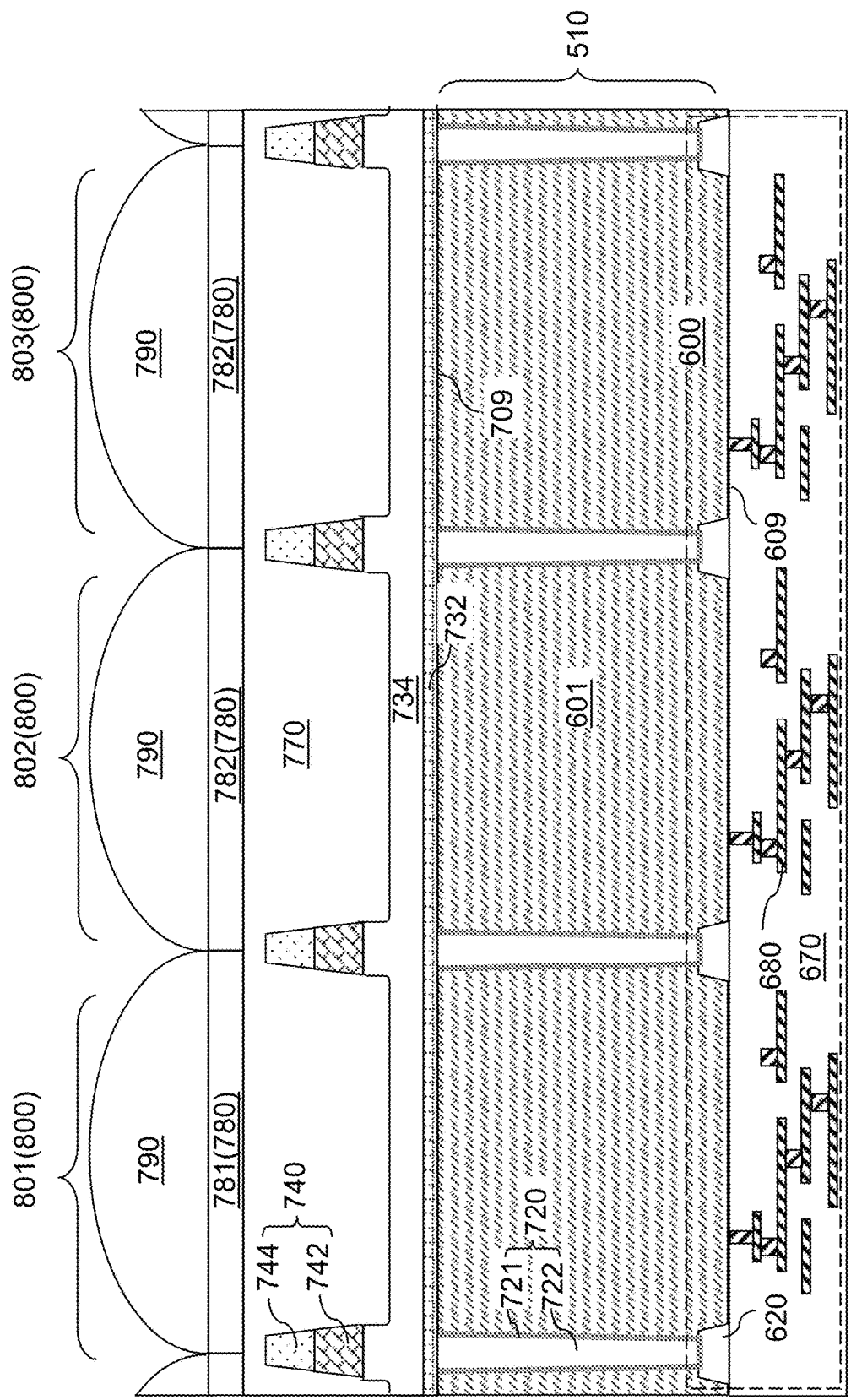
FIG. 13 is a vertical cross-sectional view of the exemplary structure after removal of the carrier substrate according to an embodiment of the present disclosure.

Referring to FIG. 13, the carrier substrate 690 and the bonding buffer layer 689 (if present) may be detached from the interconnect-level dielectric layers 670. The semiconductor substrate 510 and the device structures thereupon may be singulated into discrete image sensors prior to, or after, detaching the carrier substrate 690 from the semiconductor substrate 510.

Generally, an array 1000 of pixels may be formed on the semiconductor substrate 510. Each pixel within the array 1000 of pixels comprises at least one subpixel, and each subpixel comprise a respective photodetector (comprising a transfer transistor 630) and a respective sensing circuit (640, 650, 660) located on a front surface 609 of the semiconductor substrate 510.

Figure 14:
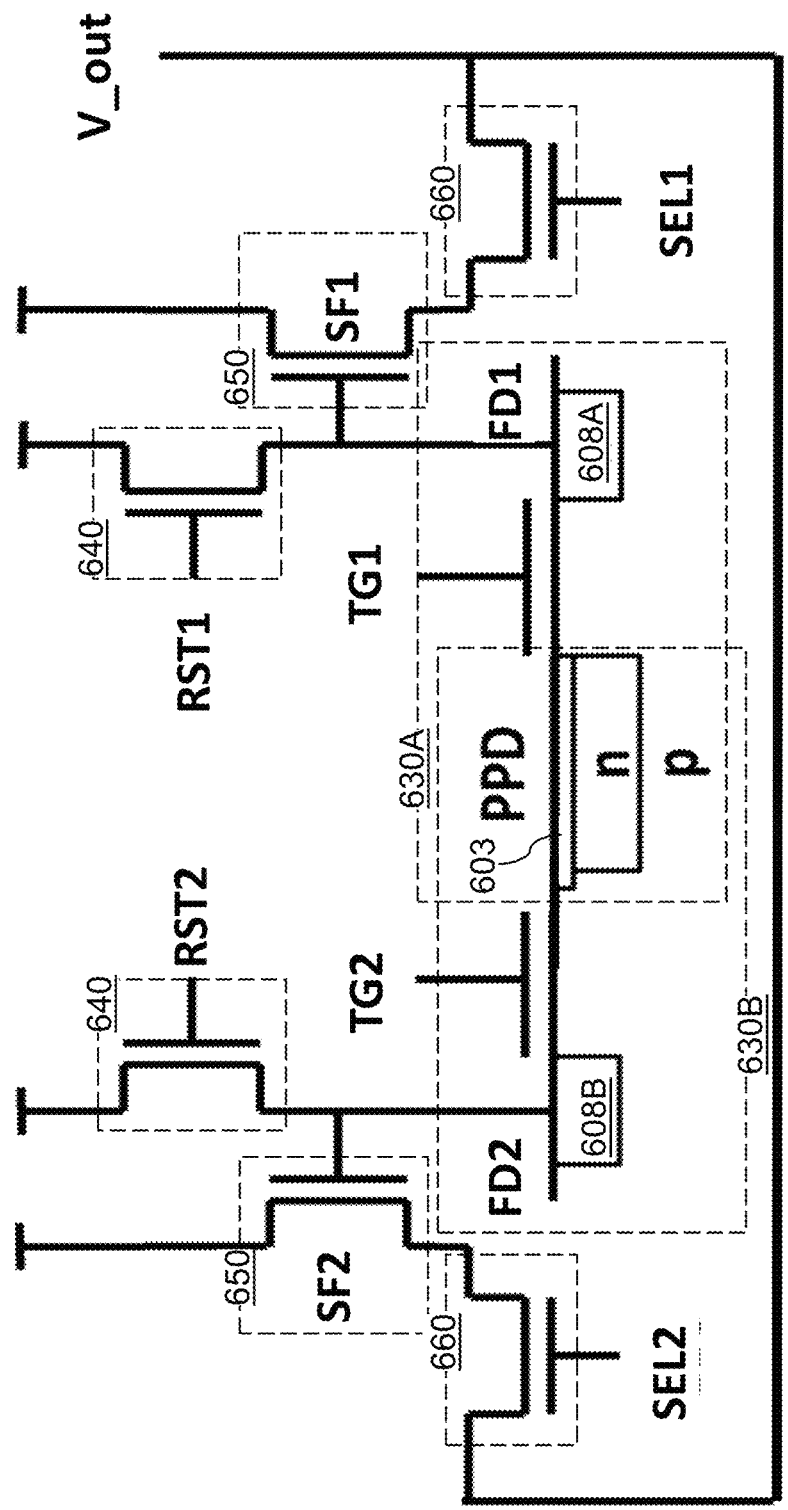
FIG. 14 is a schematic circuit diagram of a first configuration of a first photodetector circuit according to an embodiment of the present disclosure.

Referring to FIG. 14, a circuit schematic for a first configuration of a first photodetector circuit is illustrated according to an embodiment of the present disclosure. The first configuration of the first photodetector circuit includes a transfer transistor 630 and two interconnected sets of transistors (640, 650, 660). The first configuration of the first photodetector circuit may be implemented using the configurations of the first exemplary structure as illustrated in FIGS. 2A-2D. A photodetector may comprise a transfer transistor 630 (630A, 630B). The transfer transistor 630 may include a p-n junction between the combination of a second-conductivity-type pinned photodiode layer 602 and a buried second-conductivity-type pinned photodiode layer 606 and the substrate semiconductor layer 601 having a doping of the first conductivity type. A first-conductivity-type pinning layer 603 may be provided on a top side of the second-conductivity-type pinned photodiode layer 602 to provide charge pinning and thereby to reduce the dark current and white pixel effects. The set of the substrate semiconductor layer 601, the buried second-conductivity-type pinned photodiode layer 606, the second-conductivity-type pinned photodiode layer 602, and the first-conductivity-type pinning layer 603 functions as a pinned photodiode PPD. The second-conductivity-type pinned photodiode layer 602 functions as a source region of the transfer transistor 630.

A first floating diffusion region 608A (labeled as "FD1") and a second floating diffusion region 608B (labeled as "FD2") may be provided. The first floating diffusion region 608A may function as a first drain region of the transfer transistor 630A, and the second floating diffusion region 608B functions as a second drain region of the transfer transistor 630B. A first transfer gate electrode 605A (labeled "TG1") controls the transfer of the electrical charges accumulated in the second-conductivity-type pinned photodiode layer 602 into the floating diffusion region 608 through a first semiconductor channel that underlies the first transfer gate electrode 605A. A second transfer gate electrode 605B (labeled "TG2") controls the transfer of the electrical charges accumulated in the second-conductivity-type pinned photodiode layer 602 into the floating diffusion region 608 through a second semiconductor channel that underlies the second transfer gate electrode 605B. The transfer transistor 630 (either 630A or 630B) may function as a photodetector.

The sensing circuit may include two interconnected assembly of field effect transistors (640, 650, 660). Each interconnected assembly of the field effect transistors (640, 650, 660) is connected to a respective one of the first and second floating diffusion regions (608A, 608B). A first interconnected assembly of the field effect transistors (640, 650, 660) includes a first reset transistor RST1, a first source follower transistor SF1, and a first select transistor SEL1. A second interconnected assembly of the field effect transistors (640, 650, 660) includes a second reset transistor RST2, a second source follower transistor SF2, and a second select transistor SEL2. Each reset transistor 640 (i.e., RST1 and RST2) is configured to drain the electrical charges in the floating diffusion region 608 immediately before sensing so that the electrical charge that accumulates in a respective floating diffusion region (608A or 608B) during sensing is linearly proportional to the electrical charge accumulated in the second-conductivity-type pinned photodiode layer 602. The gate electrode of each source follower transistor 650 (i.e., SF1 and ST2) is electrically connected to a respective floating diffusion region (608A or 608B) via a set of metal interconnect structures. Thus, the voltage at the gate electrode of each source follower transistor 650 is proportional to the electrical charges in a respective floating diffusion region (608A or 608B). Each select transistor 660 (i.e., SEL1 and SEL2) may be turned on during a read operation to output the voltage at a common node of a respective source follower transistor and the select transistor 660 (as modulated by the voltage at the gate electrode of the respective source follower transistor 650) to a column output bus (labeled "V_out"). In one embodiment, the output node of the first select transistor SEL1 and the output node of the second select transistor SEL2 may be tied, and the gate voltages applied to the gate electrodes of the first select transistor SEL1 and the second select transistor SEL2 may be configured to output only a single output voltage from one of the two select transistors (SEL1, SEL2). A similar circuit schematic may be derived for the configuration of the first exemplary structure illustrated in FIG. 2E by providing an additional interconnected assembly of the field effect transistors (640, 650, 660) within the sensing circuit.

Figure 15:
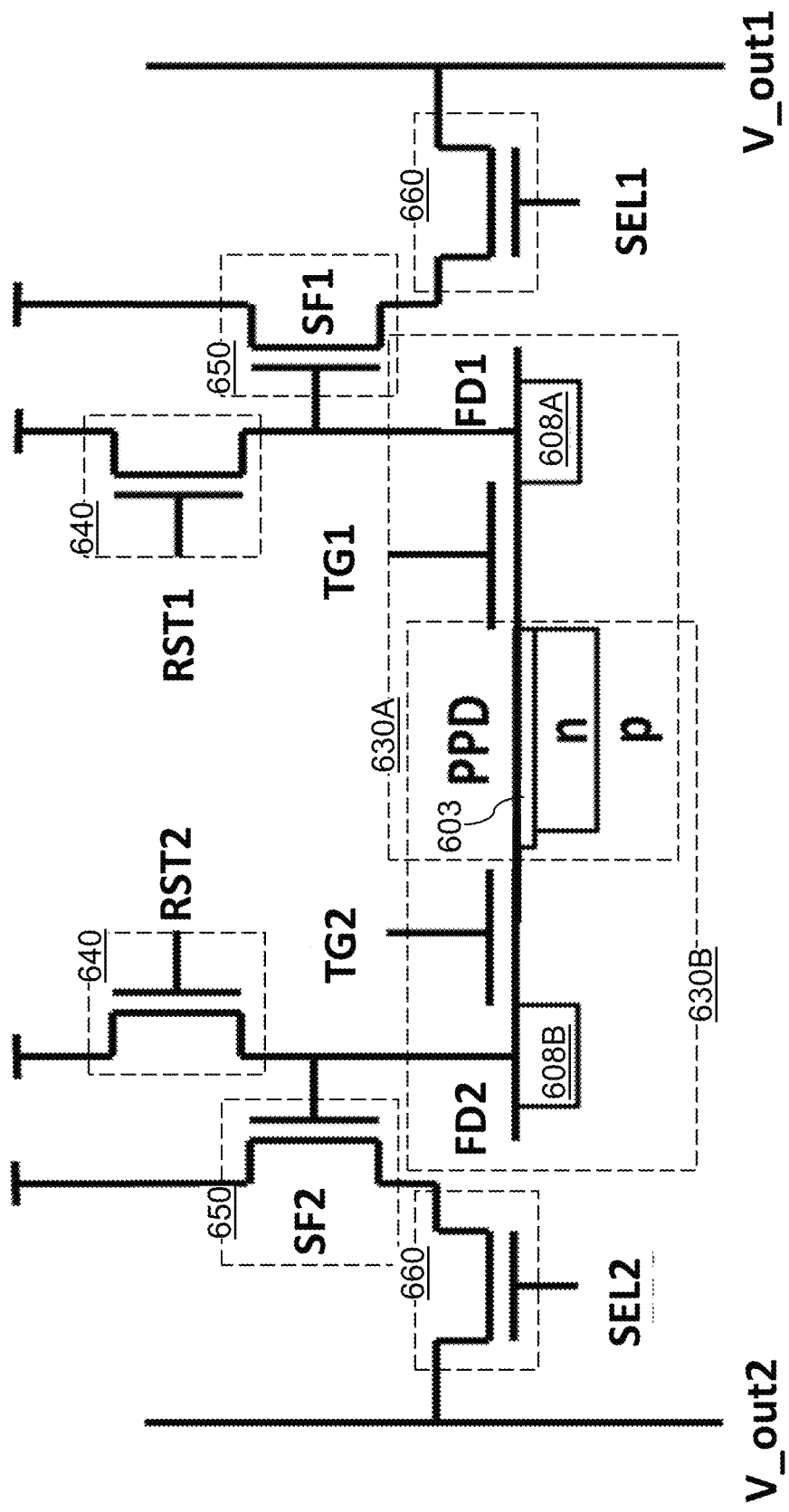
FIG. 15 is a schematic circuit diagram of a second configuration of the first photodetector circuit according to an embodiment of the present disclosure.

Referring to FIG. 15, a second configuration of the first photodetector circuit according to an embodiment of the present disclosure is illustrated. The second configuration of the first photodetector circuit may be derived from the first photodetector circuit by connecting the output voltages from the first select transistor SEL1 to a first column output bus (labeled "V_out1"), and by connecting the output voltages from the second select transistor SEL2 to a second column output bus (labeled "V_out2"). In this embodiment, the gate voltages applied to the gate electrodes of the first select transistor SEL1 and the second select transistor SEL2 may be independent of each other. The output voltage from the first select transistor SEL1 and the output voltage from the second select transistor SEL2 may be simultaneously provided to the first column output bus and the to the second column output bus. The second configuration of the first photodetector circuit may be implemented using the configurations of the first exemplary structure as illustrated in FIGS. 2A-2D.

Figure 16:
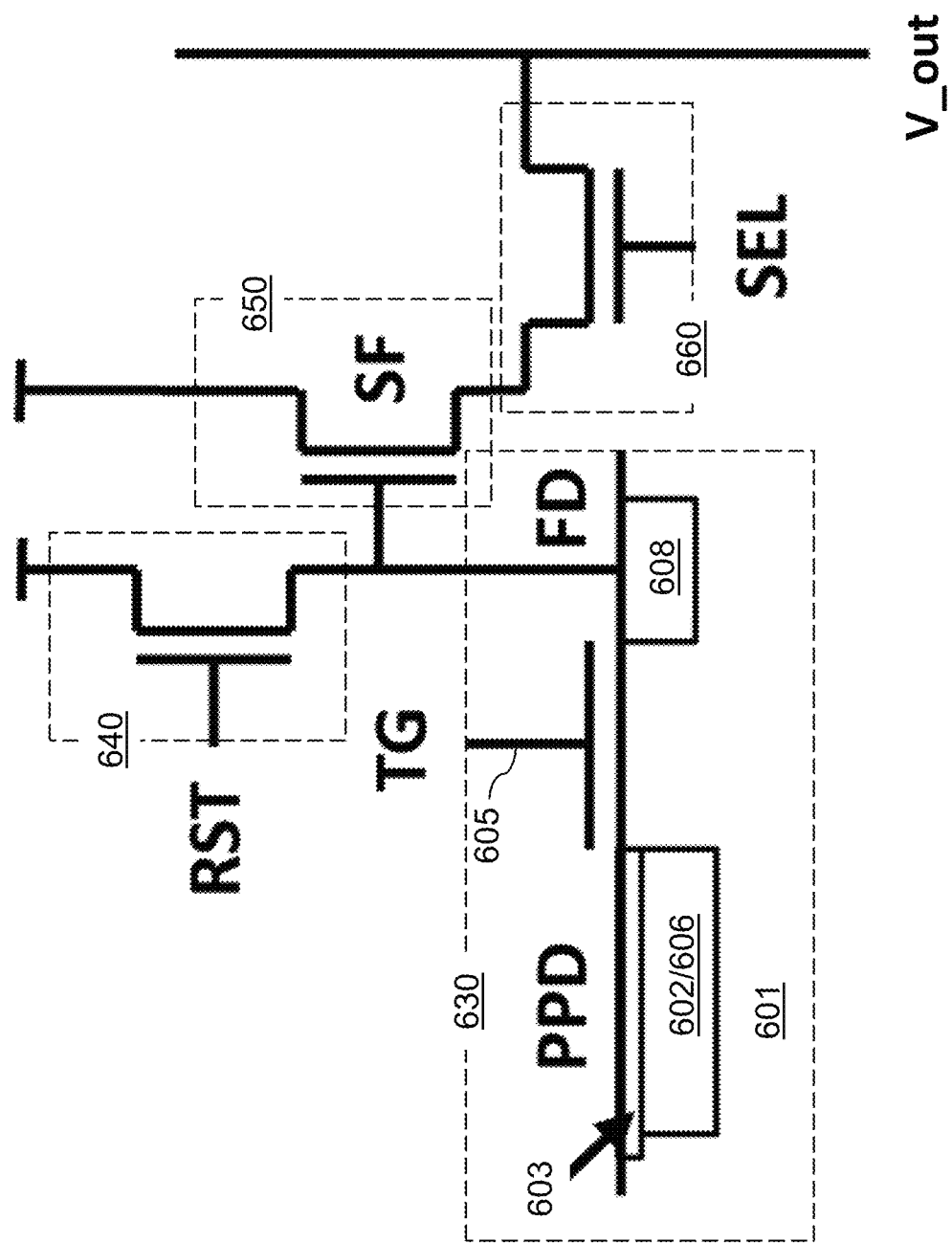
FIG. 16 is a schematic circuit diagram of a second photodetector circuit according to an embodiment of the present disclosure.

Referring to FIG. 16, a circuit schematic for a second photodetector circuit is illustrated according to an embodiment of the present disclosure. The second photodetector circuit includes a transfer transistor 630 and one interconnected set of transistors (640, 650, 660). The second photodetector circuit may be implemented using the configurations of the second exemplary structure as illustrated in FIGS. 3A-3D. The transfer transistor 630 includes a p-n junction between the combination of a second-conductivity-type pinned photodiode layer 602 and a buried second-conductivity-type pinned photodiode layer 606 and the substrate semiconductor layer 601 having a doping of the first conductivity type. A first-conductivity-type pinning layer 603 is provided on a top side of the second-conductivity-type pinned photodiode layer 602 to provide charge pinning and thereby to reduce the dark current and white pixel effects. The set of the substrate semiconductor layer 601, the buried second-conductivity-type pinned photodiode layer 606, the second-conductivity-type pinned photodiode layer 602, and the first-conductivity-type pinning layer 603 functions as a pinned photodiode PPD. The second-conductivity-type pinned photodiode layer 60 functions as a source region of the transfer transistor 630, and a floating diffusion region 608, labeled as "FD," functions as a drain region of the transfer transistor 630. The transfer gate electrode 605, labeled "TG," controls the transfer of the electrical charges accumulated in the second-conductivity-type pinned photodiode layer 602 into the floating diffusion region 608. The transfer transistor 630 (either 630A or 630B) may function as a photodetector.

The sensing circuit (640, 650, 660) may include a reset transistor 640 (labeled "RST") that is configured to drain the electrical charges in the floating diffusion region 608 immediately before sensing so that the electrical charge that accumulates in the floating diffusion region 608 during sensing is linearly proportional to the electrical charge accumulated in the second-conductivity-type pinned photodiode layer 602. The gate electrode of the source follower transistor 650 (labeled "SF") is electrically connected to the floating diffusion region 608 via a set of metal interconnect structures. Thus, the voltage at the gate electrode of the source follower transistor 650 is proportional to the electrical charges in the floating diffusion region 608. The select transistor (labeled "SEL") 660 is turned on during a read operation to output the voltage at a common node of the source follower transistor and the select transistor 660 (as modulated by the voltage at the gate electrode of the source follower transistor 650) to a column output bus (labeled "COLBUS").

Figure 17:
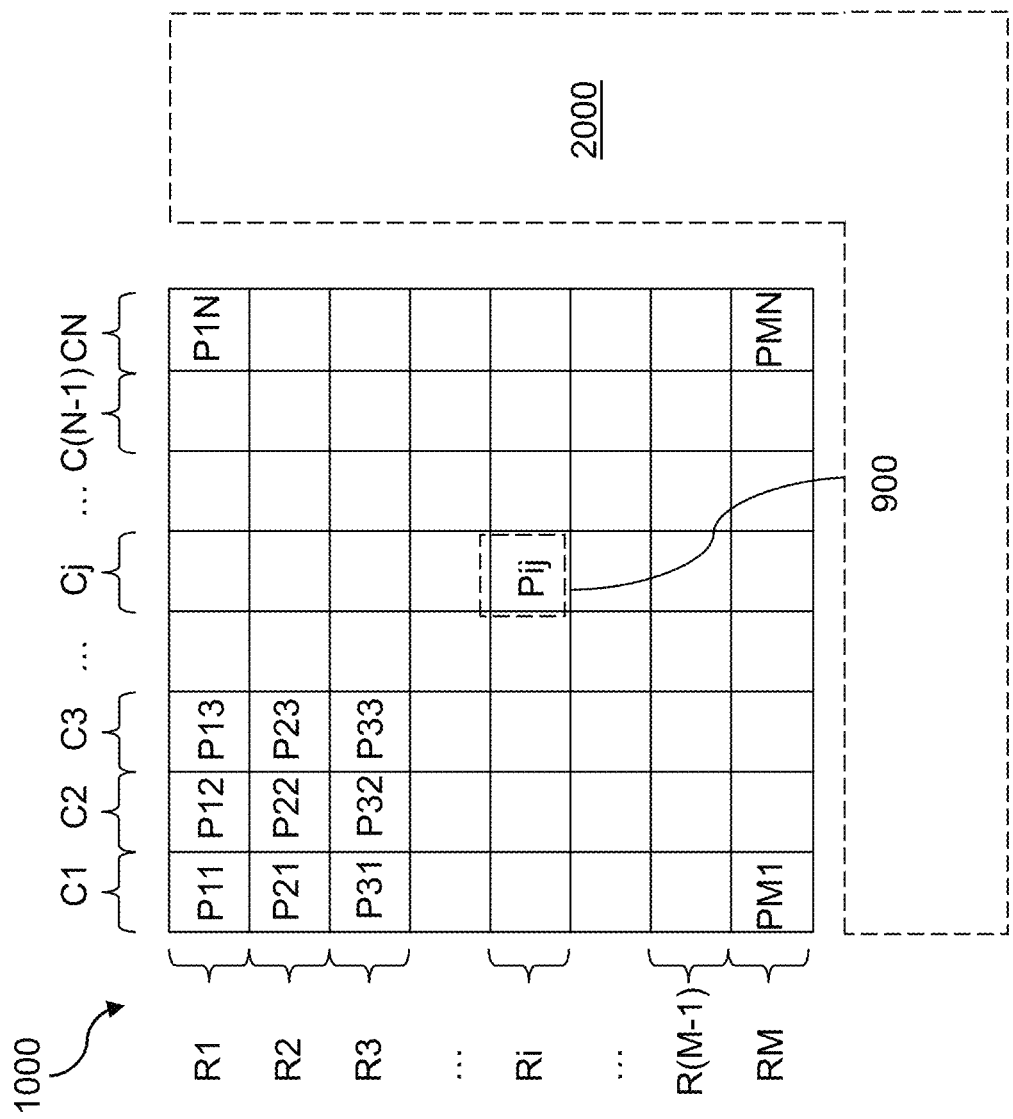
FIG. 17 schematically illustrates a CMOS image sensor incorporating the photodetector circuits and control circuits of the present disclosure.

Referring to FIG. 17, a CMOS image sensor incorporating the photodetector circuits and control circuits of the present disclosure is illustrated. The CMOS image sensor includes an array 1000 of pixels 900 embodying the various structures for subpixels 800 as described above. Further, the CMOS image sensor includes a control circuit 2000 configured to generate various control signals to be applied to the transfer gate electrodes 605 within the array 1000 and gate electrodes 615 of the field effect transistors of the sensing circuits (640, 650, 660) of the array 1000.

Each subpixel 800 includes an instance of a photodetector circuit (630, 640, 650, 660). The photodetector circuit includes a photodetector (comprising a transfer transistor 630) and a sensing circuit (640, 650, 660) that are located over a substrate semiconductor layer 601 having a doping of a first conductivity type. The photodetector comprises a second-conductivity-type pinned photodiode layer 602 that forms a p-n junction with the substrate semiconductor layer 601, at least one floating diffusion region 608 that is laterally spaced from a periphery of the second-conductivity-type pinned photodiode layer 602, and at least one transfer gate electrode 605.

According to an embodiment of the present disclosure, at least two different operations may be performed in at least one instance, and/or in each instance, of the photodetector circuit (630, 640, 650, 660) by applying at least two different pulse patterns to the at least one transfer gate electrode 605. The at least two different pulse patterns differ from one another or from each other by at least one of pulse duration, pulse magnitude, and delay time between a control signal applied to the sensing circuit (640, 650, 660) and pulse initiation at a respective one of the at least one transfer gate electrode 605.

In one embodiment, the at least two different operations that may be performed by the CMOS image sensor of FIG. 17 can comprise an image capture operation that generates an electrical output from the sensing circuit (640, 650, 660) having a magnitude in proportion to a quantity of electrical charges that accumulates in the second-conductivity-type pinned photodiode layer 602, as well as an additional operation that does not generate a two-dimensional image of detected photon intensity. In an illustrative example, the additional operation may comprise a single operation or a plurality of operations that is/are selected from a phase detection autofocus operation, a time-of-flight detection operation, a single-photon avalanche diode operation, and a near-infrared operation.

A phase detection autofocus operation is an operation that may be performed with the CMOS image sensor of the present disclosure. Paired masked pixels, which are referred to as phase detection pixels, are provided in the CMOS image sensor. The paired masked pixels may be physically spaced from each other to provide detection of phase information upon taking the two low-resolution photos. Two different lower-resolution images may be taken using the phase detection pixels, and may be compared to find an optimal setting for the lense(s) for a best possible image for the high resolution image. Specifically, the phase information generated from the phase detection pixels may be used to determine the focal length for an optimal high resolution image. After the general processing unit for an image sensor receives the focal length information, the general processing unit may drive the lens to move to a position with the optimal focus. The phase detection autofocus operation may provide speed adjustment of the focal length of the lens of the CMOS image sensor.

A time-of-flight detection operation uses time-of-flight techniques to resolve distance between the CMOS image sensor of the present disclosure and the subject for each point of the image taken by the CMOS image sensor by measuring the round trip time of an artificial light signal provided by a laser or a light emitting diode that emits light at a predetermined wavelength. Each pixel of the CMOS image sensor may comprise, and/or consist of, a subpixel configured to detect the light of the predetermined wavelength. Laser-based time-of-flight detection operation may be used as a part of a scannerless light detection and ranging (LIDAR) operation, in which the entire scene is captured with each laser pulse, as opposed to point-by-point with a laser beam such as in scanning LIDAR systems. The time-of-flight detection operation may be used to determine distances within ranges of a few centimeters up to several kilometers. Currently, the distance resolution is about 1 cm. During the time-of-flight detection operation, each pixel (and/or each subpixel) may measure the time the light has taken to travel from an illumination unit (which may be a laser source or a light emitting diode) to the object and back to the CMOS image sensor. Fast operation of the various gate electrodes (615, 605) may be used.

A single-photon avalanche diode operation is an operation in which a photon-generated carrier triggers a large avalanche current of a short duration through the photoelectric effect. Charge carriers (such as electrons and holes) are accelerated to have high kinetic energies in a high electrical field by impact ionization. The high kinetic energy of the charge carriers generates additional charge carriers by ionizing the bulk material. The number of charge carriers may increase exponentially in the presence of high electrical field from a single charge carrier. In the single-photon avalanche operation, the p-n junctions of the pixels of the CMOS image sensor are reverse biased. The pixels may be designed to operate with a reverse-bias voltage well above the breakdown voltage. The single-photon avalanche diode operation may be effectively performed by providing a circuit in the control circuitry that is configured to sense the leading edge of the avalanche current, to generate a standard output pulse synchronous with the avalanche build-up, to quench the avalanche by lowering the bias down to the breakdown voltage, and to restore the photodiode to the operative level. The intensity of the signal may be obtained by counting the number of output pulses within a measurement time slot. A time-dependent waveform of the signal may be obtained by measuring the time distribution of the output pulses.

A near-infrared operation is an operation in which near infra-red light is captured using an array of subpixels that include near-infrared filters. The timing of the control pulses for the near-infrared operation may be different from the timing of the control pulses for generating an image based on light in the visible spectrum. Particularly, the exposure time for the photodetectors (comprising the transfer transistors 630) may be elongated due to the low sensitivity of the photodetectors at near-infrared range, and the pulse patterns for the various gate electrodes (605, 615) of the photodetectors may be modified compared to normal operations for capturing an image in the visible light spectrum.

The additional operation may be related to enhancing the quality of the image captured by the CMOS image sensor by suppressing background noise. In one embodiment, the photodetector comprises a first-conductivity-type pinning layer 603 forming another p-n junction with the second-conductivity-type pinned photodiode layer 602, and the additional operation comprises a pinning operation that accumulates charge carriers of the first conductivity type in the first-conductivity-type pinning layer 603. In one embodiment, the additional operation comprises an overflow discharge operation in which electrical charges in the second-conductivity-type pinned photodiode layer 602 are drained prior to performing the image capture operation.

Figure 18:
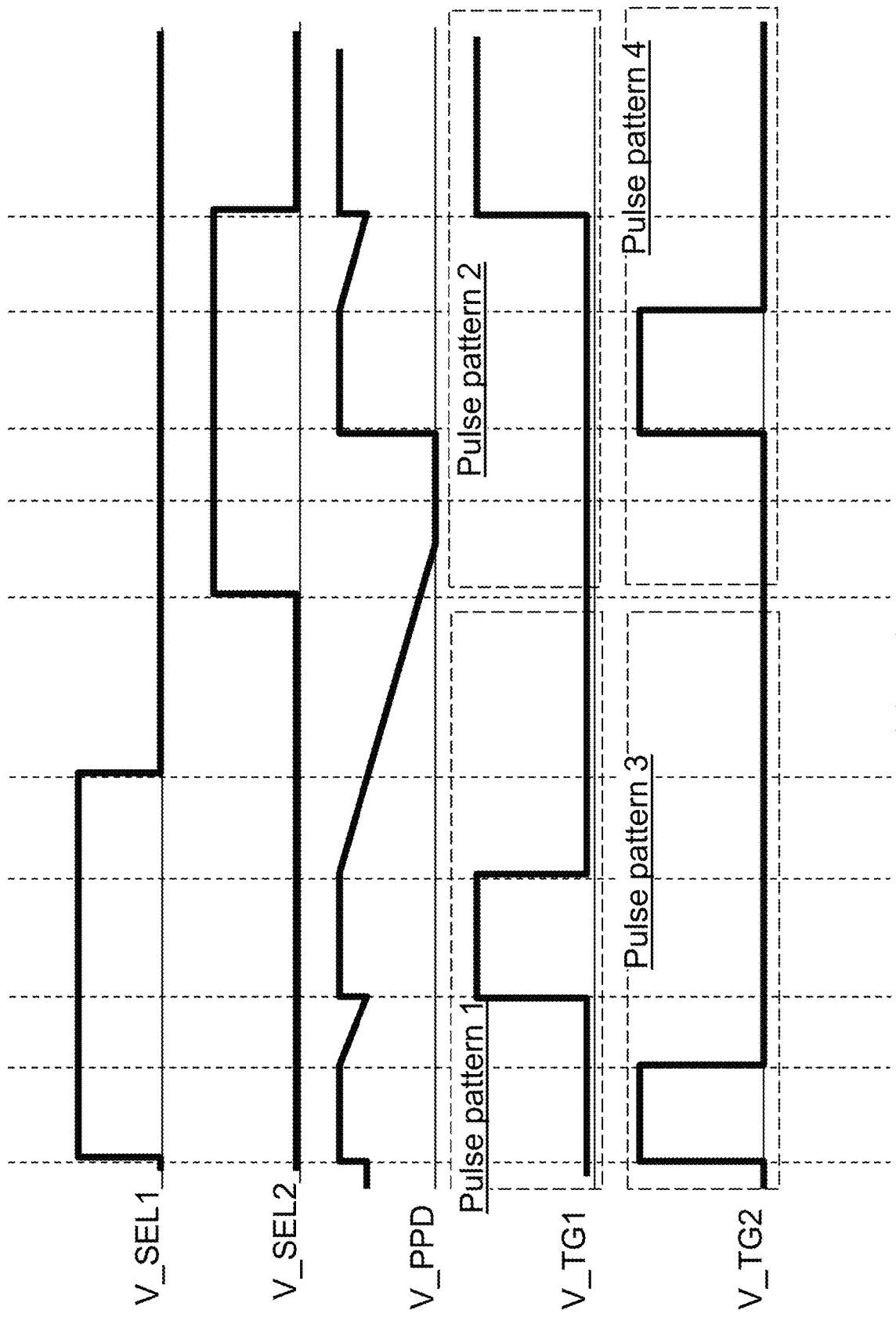
FIG. 18 is a timing diagram illustrating exemplary set of voltage signals as a function of time during operation of the first exemplary photodetector circuit according to an embodiment of the present disclosure.

Referring to FIG. 18, an exemplary set of voltages are illustrated as a function of time during operation of the first exemplary photodetector circuit of FIG. 14 or FIG. 15. V_PPD refers to the voltage at the pinned photodetector PPD of FIG. 14 or FIG. 15. V_TG1 refers to the voltage applied to the first transfer gate electrode TG1, and V_TG2 refers to the voltage applied to the second transfer gate electrode TG2. V_SEL1 refers to the voltage applied to the gate electrode of the first selector transistor SEL1, and V_SEL2 refers to the voltage applied to the gate electrode of the second selector transistor SEL2. Different pulse patterns (as illustrated by V_TG1 and V_TG2) may be simultaneously applied to a plurality of transfer gate electrodes 605 within a same subpixel, i.e., within a same photodetector circuit (630, 640, 650, 660). Further, each transfer gate electrode (TG1, TG2) may be electrically biased with a respective string of pulse patterns that include at least two different pulse patterns. Generally, the different pulse patterns that are applied to the plurality of transfer gate electrodes 605 can enable simultaneous multiple operations of the first exemplary photodetector circuit of FIG. 14 or FIG. 15. The simultaneous multiple operations can include an image capture operation and at least one additional operation such as a phase detection autofocus operation, a time-of-flight detection operation, a single-photon avalanche diode operation, and/or a near-infrared operation.

Figure 19:
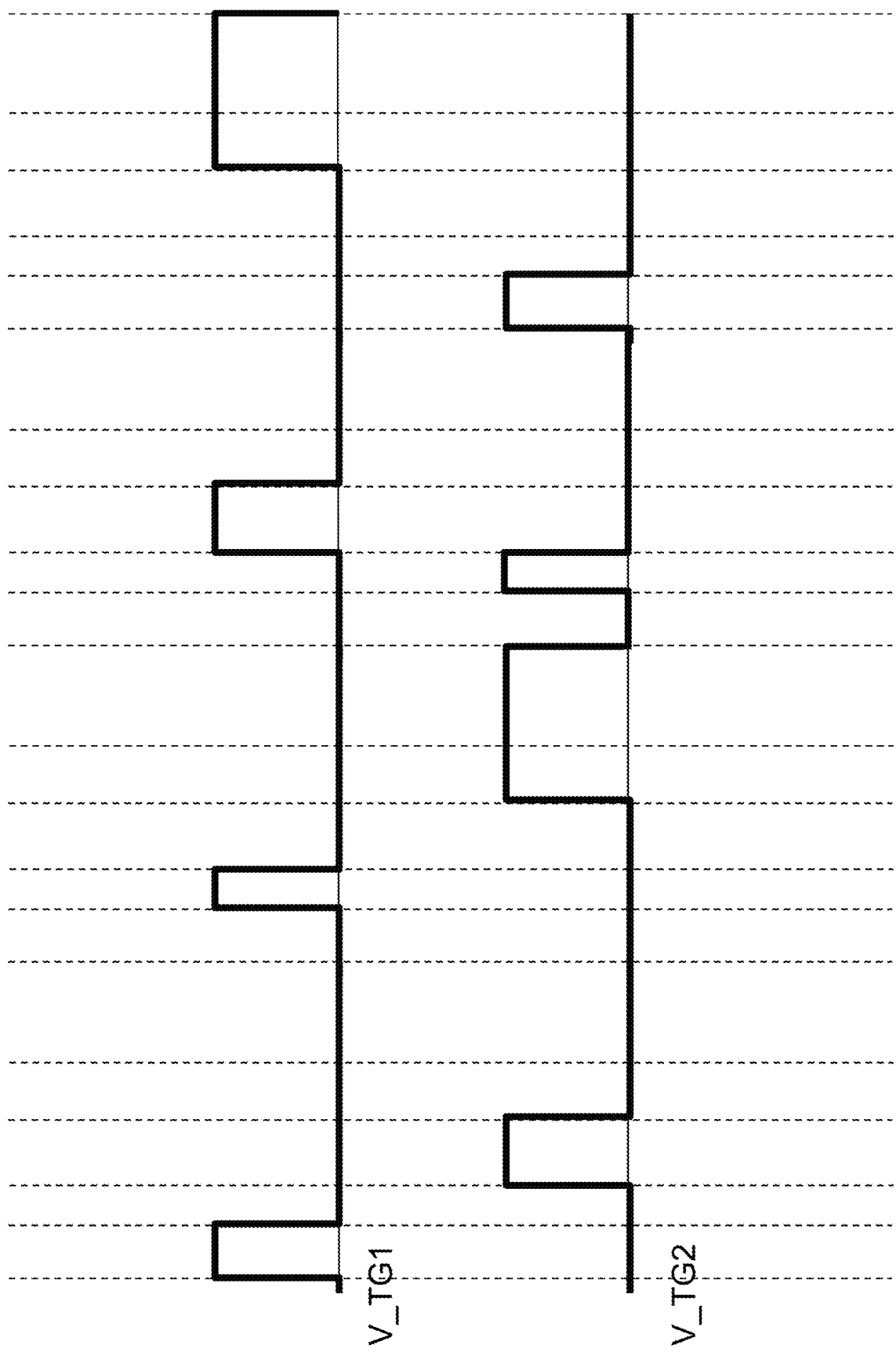
FIG. 19 is a timing diagram illustrating exemplary pulse patterns for two transfer gate electrodes in the first exemplary photodetector circuit according to an embodiment of the present disclosure.

Referring to FIG. 19, exemplary pulse patterns for two transfer gate electrodes (TG1, TG2) in the first exemplary photodetector circuit are illustrated according to an embodiment of the present disclosure. In this example, four different pulse patterns may be sequentially applied to each of the two transfer gate electrodes (TG1, TG2) to provide four different operations for each of the two transfer gate electrodes (TG1, TG2). Further, the operations that are performed by the two transfer gate electrodes (TG1, TG2) may be of the same type, or of different types.

Referring collectively to FIGS. 14, 15, 18, and 19, the at least one transfer gate electrode 605 of each subpixel may comprises a plurality of transfer gate electrodes 605. The at least two different pulse patterns may be applied to at least two different transfer gate electrodes 605 within the plurality of transfer gate electrodes 605. In one embodiment, the at least one floating diffusion region 608 may comprise a plurality of floating diffusion regions 608 that are electrically isolated from each other or one another. In one embodiment, the plurality of floating diffusion regions 608 comprises a first floating diffusion region 608A and a second floating diffusion region 608B, and the plurality of transfer gate electrodes 605 comprises a first transfer gate electrode 605A overlying a first channel region located between the second-conductivity-type pinned photodiode layer 602 and the first floating diffusion region 608A, and comprises a second transfer gate electrode 605B overlying a second channel region located between the second-conductivity-type pinned photodiode layer 602 and the second floating diffusion region 608B.

In one embodiment, the sensing circuit (640, 650, 660) comprises a first source follower transistor SF1 configured to generate a first output voltage in proportion to electrical charges that accumulate in the first floating diffusion region 608A, and a second source follower transistor SF2 configured to generate a second output voltage in proportion to electrical charges that accumulate in the second floating diffusion region 608B. In one embodiment, the sensing circuit (640, 650, 660) comprises two output nodes (such as the nodes of V_out1 and V_out2) configured to independently output a first output voltage from the first source follower transistor SF1 and a second output voltage from the second source follower transistor SF1 as illustrated in FIG. 15. In another embodiment, the sensing circuit (640, 650, 660) comprises two output nodes (such as the nodes of V_out1 and V_out2) configured to output a voltage selected from a first output voltage from the first source follower transistor SF1 and a second output voltage from the second source follower transistor SF2 one at a time as illustrated in FIG. 14.

Figure 20:
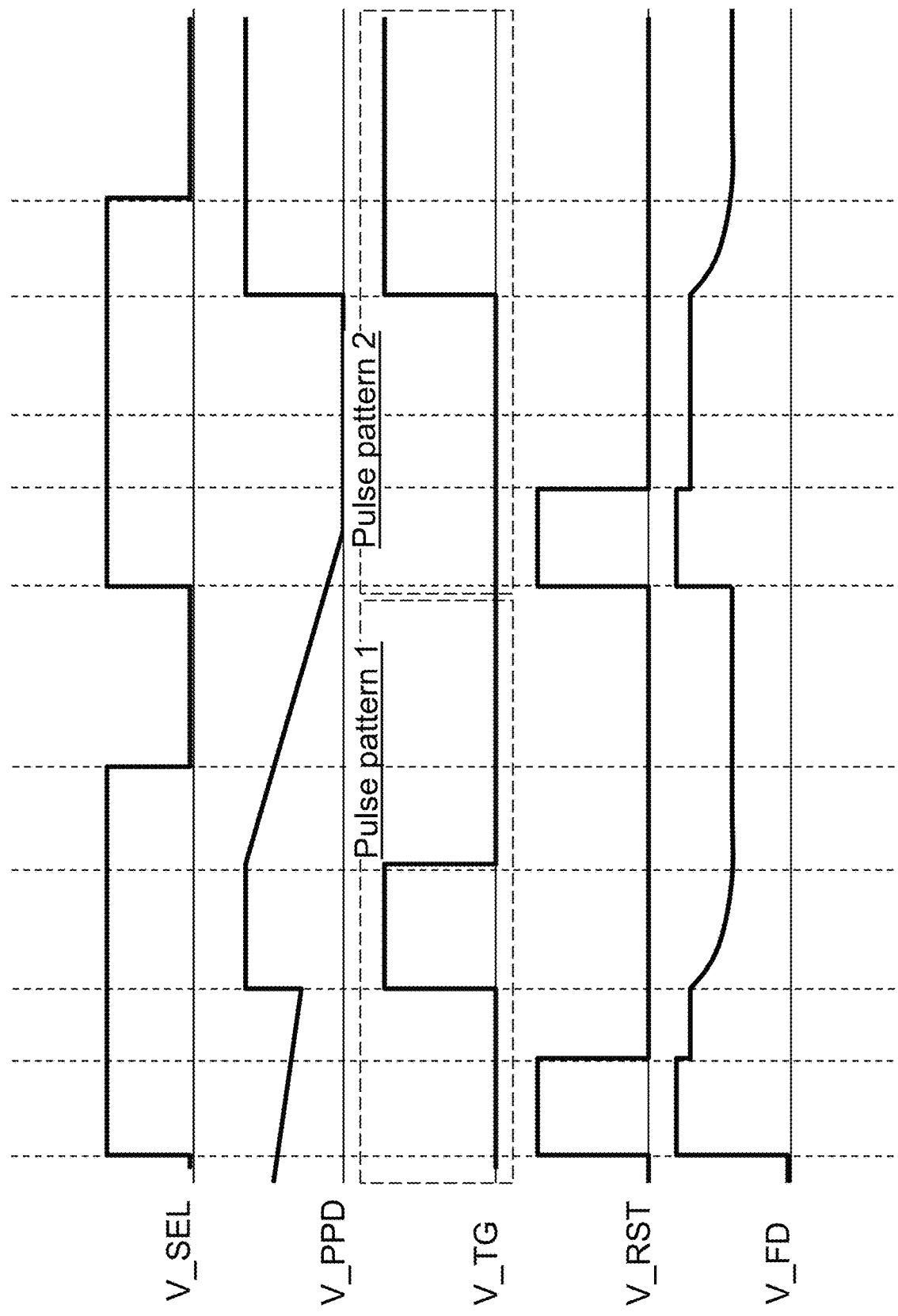
FIG. 20 is a timing diagram illustrating exemplary set of voltages as a function of time during operation of the second exemplary photodetector circuit according to an embodiment of the present disclosure.

Referring to FIG. 20, an exemplary set of voltages are illustrated as a function of time during operation of the second exemplary photodetector circuit of FIG. 16. V_SEL refers to the voltage applied to the gate of the select transistor SEL of FIG. 16. V_PPD refers to the voltage at the pinned photodetector PPD of FIG. 16. V_TG refers to the voltage applied to the transfer gate electrode TG. V_RST refers to the voltage applied to the gate electrode of the reset transistor RST (i.e., the reset transistor 640). V_FD refers to the voltage at the floating diffusion region 608. Different pulse patterns (such as pulse pattern 1 and pulse pattern 2) may be simultaneously applied to the transfer gate electrode 605. In other words, the transfer gate electrode 605 may be electrically biased with a respective string of pulse patterns that include at least two different pulse patterns. The at least two different pulse patterns may be selected to sequentially enable an image capture operation and at least one additional operation such as a phase detection autofocus operation, a time-of-flight detection operation, a single-photon avalanche diode operation, and/or a near-infrared operation.

Figure 21:
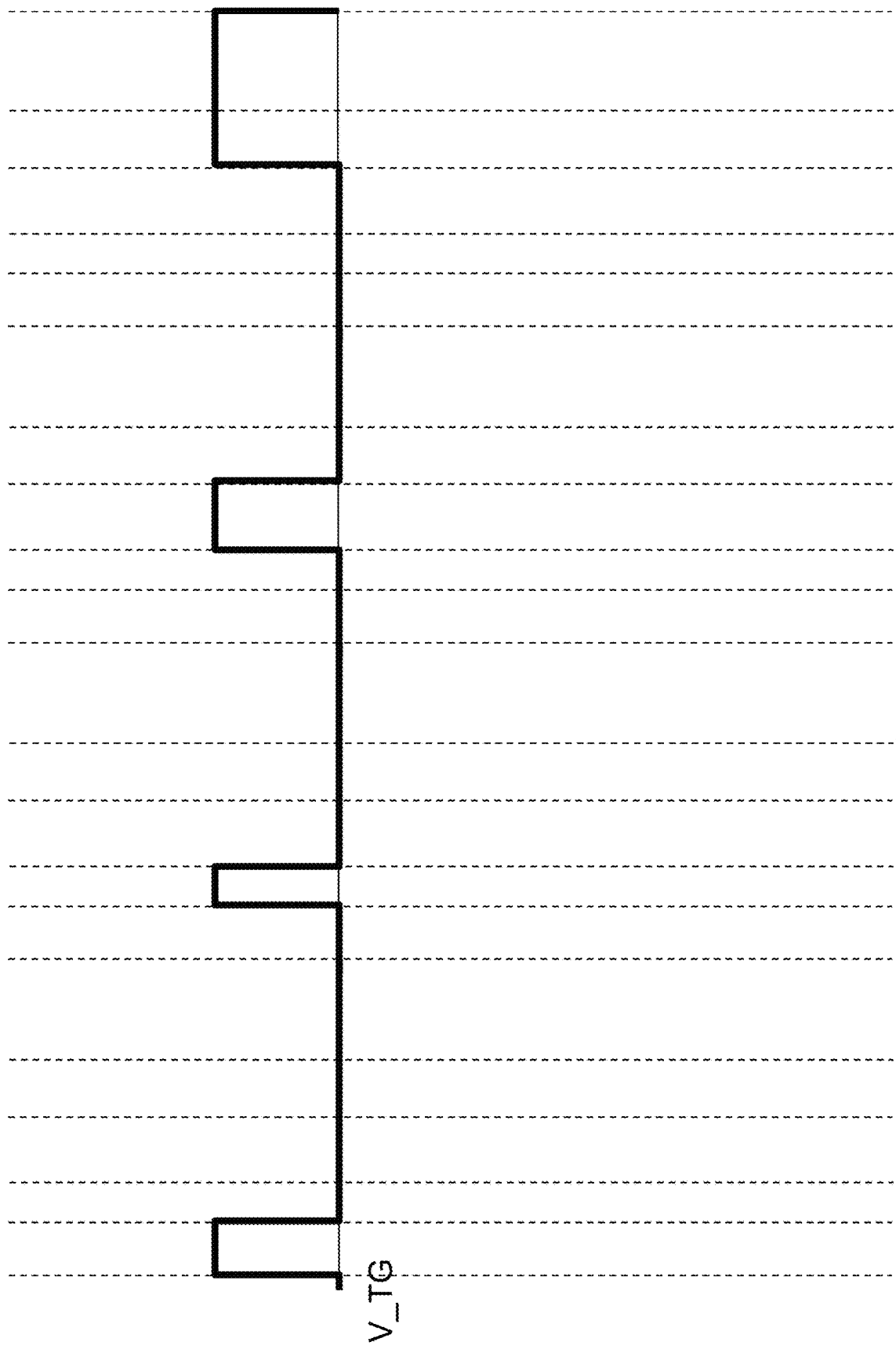
FIG. 21 is a timing diagram illustrating exemplary pulse pattern for a transfer gate electrode in the second photodetector circuit according to an embodiment of the present disclosure.

Referring to FIG. 21, an exemplary pulse pattern for the transfer gate electrode 605 in the second exemplary photodetector circuit is illustrated according to an embodiment of the present disclosure. In this example, four different pulse patterns may be sequentially applied to the transfer gate electrode 605 to provide four different operations for the transfer gate electrode 605. Generally, any sequential combination of different pulse patterns can be applied to a transfer gate electrode 605 to enable sequential multiple operations in second exemplary photodetector circuit of FIG. 16. The sequential multiple operations can include an image capture operation and at least one additional operation such as a phase detection autofocus operation, a time-of-flight detection operation, a single-photon avalanche diode operation, and/or a near-infrared operation.

Referring collectively to FIGS. 16, 20, and 21, the at least one transfer gate electrode 605 of each subpixel may consist of a single transfer gate electrode 605, and the at least two different pulse patterns are sequentially applied to the single transfer gate electrode 605.

Figure 22:
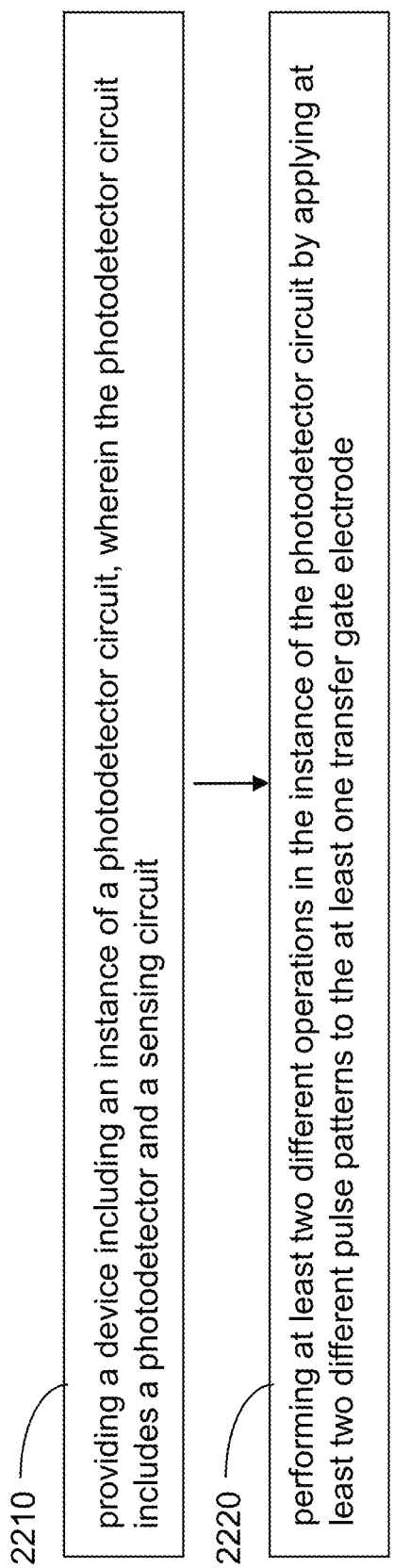
FIG. 22 is a process flow diagram illustrating an exemplary process sequence for forming an image sensor according to an embodiment of the present disclosure.

Referring to FIG. 22, a general method of operating a device such as an image sensor is provided according to an embodiment of the present disclosure. Referring to step 2210, a device including an instance of a photodetector circuit (630, 640, 650 660) is provided. The photodetector circuit (630, 640, 650 660) includes a photodetector (comprising a transfer transistor 630) and a sensing circuit (640, 650, 660). The photodetector and the sensing circuit (640, 650, 660) are located over a substrate semiconductor layer 601 having a doping of a first conductivity type. The photodetector comprises a second-conductivity-type pinned photodiode layer 602 that forms a p-n junction with the substrate semiconductor layer 601, at least one floating diffusion region 608 that is laterally spaced from a periphery of the second-conductivity-type pinned photodiode layer 602, and at least one transfer gate electrode 605. Referring to step 2220, at least two different operations may be performed in the instance of the photodetector circuit (630, 640, 650 660) by applying at least two different pulse patterns to the at least one transfer gate electrode 605.

Generally, the photodetector circuits of embodiments of the present disclosure may comprise instances of a subpixel within a CMOS image sensor including an array 1000 of pixels 900. Each of the pixels 900 may comprise at least one subpixel.

Referring to all drawings and according to various embodiments of the present disclosure, a method of operating a device is provided, wherein the method includes the operation of providing the device including an instance of a photodetector circuit 630, 640, 650, 660, wherein the photodetector circuit 630, 640, 650, 660 includes a photodetector 630 and a sensing circuit 640, 650, 660 that are located over a substrate semiconductor layer 601 having a doping of a first conductivity type, wherein the photodetector 630 comprises a second-conductivity-type pinned photodiode layer 602 that forms a p-n junction with the substrate semiconductor layer 601, at least one floating diffusion region 608 that is laterally spaced from a periphery of the second-conductivity-type pinned photodiode layer 602, and at least one transfer gate electrode 605. The method further includes the operation of performing at least two different operations in the instance of the photodetector circuit by applying at least two different pulse patterns to the at least one transfer gate electrode 605, wherein the at least two different pulse patterns differ from one another by at least one of pulse duration, pulse magnitude, and delay time between a control signal applied to the sensing circuit 640, 650, 660 and pulse initiation at a respective one of the at least one transfer gate electrode 605.

In an embodiment, a semiconductor device is provided, which comprises a substrate semiconductor layer 601 having a doping of a first conductivity type, and a photodetector circuit (630, 640, 650, 660) located on the substrate semiconductor layer 601 and comprising a photodetector (comprising a transfer transistor 630) and a sensing circuit (640, 650, 660). The photodetector comprises a second-conductivity-type pinned photodiode layer 602 that forms a p-n junction with the substrate semiconductor layer 601, at least one floating diffusion region 608 that is laterally spaced from a periphery of the second-conductivity-type pinned photodiode layer 602, and at least one transfer gate electrode 605. The photodetector circuit (630, 640, 650, 660) is configured to perform at least two different operations by applying at least two different pulse patterns to the at least one transfer gate electrode 605, simultaneously and/or sequentially. The at least two different pulse patterns differ from one another or from each other by at least one of pulse duration, pulse magnitude, and delay time between a control signal applied to the sensing circuit (640, 650, 660) (which may include gate control voltages to any of the transistors in the sensing circuit) and pulse initiation at a respective one of the at least one transfer gate electrode 605.

In one embodiment, the at least one transfer gate electrode 605 consists of a single transfer gate electrode (as illustrated in FIGS. 3A-3C and 16), and the at least two different pulse patterns may be sequentially applied to the single transfer gate electrode 605 (as illustrated in FIGS. 20 and 21).

In one embodiment, the at least one transfer gate electrode 605 comprises a plurality of transfer gate electrodes 605 (as illustrated in FIGS. 2A-2E, 14, and 15), and the at least two different pulse patterns are applied to at least two different transfer gate electrodes 605 within the plurality of transfer gate electrodes 605 (as illustrated in FIGS. 18 and 19).

In one embodiment, the at least one floating diffusion region 608 comprises a plurality of floating diffusion regions 608 that are electrically isolated from each other or one another (as illustrated in FIGS. 2A-2E, 14, and 15). In one embodiment, the plurality of floating diffusion regions 608 comprises a first floating diffusion region 608A and a second floating diffusion region 608B, and the plurality of transfer gate electrodes 605 comprises a first transfer gate electrode 605A overlying a first channel region located between the second-conductivity-type pinned photodiode layer 602 and the first floating diffusion region 608A, and comprises a second transfer gate electrode 605B overlying a second channel region located between the second-conductivity-type pinned photodiode layer 602 and the second floating diffusion region 608B. In one embodiment, the sensing circuit (640, 650, 660) comprises a first source follower transistor SF1 configured to generate a first output voltage in proportion to electrical charges that accumulate in the first floating diffusion region 608A (i.e., FD1) and a second source follower transistor SF2 configured to generate a second output voltage in proportion to electrical charges that accumulate in the second floating diffusion region 608B (i.e., FD2).

According to an embodiment of the present disclosure, a CMOS image sensor including an array 1000 of pixels 900 located on a substrate semiconductor layer 601 having a doping of a first conductivity type is provided. Each of the pixels 900 comprises at least one subpixel 800, and each subpixel 800 comprises a photodetector circuit (630, 640, 650, 660) including a photodetector comprising a transfer transistor 630 and a sensing circuit (640, 650, 660). The photodetector comprises a second-conductivity-type pinned photodiode layer 602 that forms a p-n junction with the substrate semiconductor layer 601, a plurality of floating diffusion regions 608 that are electrically isolated from each other or one another and are laterally spaced from a periphery of the second-conductivity-type pinned photodiode layer 602, and a plurality of transfer gate electrodes 605. The photodetector circuit (640, 650, 660) may be configured to perform at least two different operations by applying at least two different pulse patterns to the plurality of transfer gate electrodes 605 simultaneously and/or sequentially. The at least two different pulse patterns differ from one another or from each other by at least one of pulse duration, pulse magnitude, and delay time between a control signal applied to the sensing circuit and pulse initiation at a respective one of the plurality of transfer gate electrodes 605.

In one embodiment, the plurality of floating diffusion regions 608 comprises a first floating diffusion region 608A and a second floating diffusion region 608B. The plurality of transfer gate electrodes 605 comprises a first transfer gate electrode 605A overlying a first channel region located between the second-conductivity-type pinned photodiode layer 602 and the first floating diffusion region 608A, and comprises a second transfer gate electrode 605B overlying a second channel region located between the second-conductivity-type pinned photodiode layer 602 and the second floating diffusion region 608B. The sensing circuit comprises a first source follower transistor SF1 configured to generate a first output voltage in proportion to electrical charges that accumulate in the first floating diffusion region 608A, and a second source follower transistor configured to generate a second output voltage in proportion to electrical charges that accumulate in the second floating diffusion region 608B.

The various methods and structures of the present disclosure may be used to provide a photodetector circuit, which may comprise a subpixel of a CMOS image sensor and may perform multiple functions using a common pinned photodiode PPD. The multiple functions may include a typical image capture operation and at least another additional operation that may provide additional functionality to the CMOS image sensor, and/or may enhance the quality of the captured image.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a device, comprising:
providing the device including an instance of a photodetector circuit, wherein the photodetector circuit includes a photodetector and a sensing circuit that are located over a substrate semiconductor layer having a doping of a first conductivity type, wherein the photodetector comprises a second-conductivity-type pinned photodiode layer that forms a p-n junction with the substrate semiconductor layer, at least one floating diffusion region that is laterally spaced from a periphery of the second-conductivity-type pinned photodiode layer, and at least one transfer gate electrode; and
performing at least two different operations in the instance of the photodetector circuit by applying at least two different pulse patterns to the at least one transfer gate electrode, wherein the at least two different pulse patterns differ from one another by at least one of pulse duration, pulse magnitude, and delay time between a control signal applied to the sensing circuit and pulse initiation at a respective one of the at least one transfer gate electrode,
wherein the at least two different operations comprise an image capture operation and at least one additional operation selected from a phase detection autofocus operation, a single-photon avalanche diode operation, or a near-infrared operation.

2. The method of claim 1, wherein:
the image capture operation generates an electrical output from the sensing circuit having a magnitude in proportion to a quantity of electrical charges that accumulates in the second-conductivity-type pinned photodiode layer; and
the at least one additional operation enhances a quality of a two-dimensional image of detected photon intensity.

3. The method of claim 2, wherein:
the photodetector comprises a first-conductivity-type pinning layer forming another p-n junction with the second-conductivity-type pinned photodiode layer; and
the at least one additional operation comprises a pinning operation that accumulates charge carriers of the first conductivity type in the first-conductivity-type pinning layer.

4. The method of claim 2, wherein the at least one additional operation comprises an overflow discharge operation in which electrical charges in the second-conductivity-type pinned photodiode layer are drained prior to performing the image capture operation.

5. The method of claim 1, wherein:
the at least one transfer gate electrode consists of a single transfer gate electrode; and the at least two different pulse patterns are sequentially applied to the single transfer gate electrode.

6. The method of claim 1, wherein:
the at least one transfer gate electrode comprises a plurality of transfer gate electrodes; and
the at least two different pulse patterns are applied to at least two different transfer gate electrodes within the plurality of transfer gate electrodes.

7. The method of claim 1, wherein the at least one floating diffusion region comprises a plurality of floating diffusion regions that are electrically isolated from each other or one another.

8. The method of claim 7, wherein:
the plurality of floating diffusion regions comprises a first floating diffusion region and a second floating diffusion region; and
the plurality of transfer gate electrodes comprises a first transfer gate electrode overlying a first channel region located between the second-conductivity-type pinned photodiode layer and the first floating diffusion region, and comprises a second transfer gate electrode overlying a second channel region located between the second-conductivity-type pinned photodiode layer and the second floating diffusion region.

9. The method of claim 1, wherein:
the at least one transfer gate electrode comprises a plurality of transfer gate electrodes;
the at least one floating diffusion region comprises a plurality of floating diffusion regions;
one of the plurality of transfer gate electrodes and one of the plurality of floating diffusion region are configured to perform the an image capture operation; and
another of the plurality of plurality of gate electrodes and another of the plurality of floating diffusion regions are configured to perform the at least one additional operation.

10. A semiconductor structure comprising:
a substrate semiconductor layer having a doping of a first conductivity type; and
a photodetector circuit located on the substrate semiconductor layer and comprising a photodetector and a sensing circuit,
wherein:
the photodetector comprises a second-conductivity-type pinned photodiode layer that forms a p-n junction with the substrate semiconductor layer, at least one floating diffusion region that is laterally spaced from a periphery of the second-conductivity-type pinned photodiode layer, and at least one transfer gate electrode;
the photodetector circuit is configured to perform at least two different operations by applying at least two different pulse patterns to the at least one transfer gate electrode; and
the at least two different pulse patterns differ from one another or from each other by at least one of pulse duration, pulse magnitude, and delay time between a control signal applied to the sensing circuit and pulse initiation at a respective one of the at least one transfer gate electrode,
wherein the at least two different operations comprise an image capture operation and at least one additional operation selected from a phase detection autofocus operation, a single-photon avalanche diode operation, or a near-infrared operation.

11. The semiconductor structure of claim 10, wherein:
the at least one transfer gate electrode consists of a single transfer gate electrode; and
the at least two different pulse patterns are sequentially applied to the single transfer gate electrode.

12. The semiconductor structure of claim 10, wherein:
the at least one transfer gate electrode comprises a plurality of transfer gate electrodes; and
the at least two different pulse patterns are applied to at least two different transfer gate electrodes within the plurality of transfer gate electrodes.

13. The semiconductor structure of claim 10, wherein the at least one floating diffusion region comprises a plurality of floating diffusion regions that are electrically isolated from each other or one another.

14. The semiconductor structure of claim 13, wherein:
the plurality of floating diffusion regions comprises a first floating diffusion region and a second floating diffusion region; and
the plurality of transfer gate electrodes comprises a first transfer gate electrode overlying a first channel region located between the second-conductivity-type pinned photodiode layer and the first floating diffusion region, and comprises a second transfer gate electrode overlying a second channel region located between the second-conductivity-type pinned photodiode layer and the second floating diffusion region.

15. The semiconductor structure of claim 14, wherein the sensing circuit comprises:
a first source follower transistor configured to generate a first output voltage in proportion to electrical charges that accumulate in the first floating diffusion region; and
a second source follower transistor configured to generate a second output voltage in proportion to electrical charges that accumulate in the second floating diffusion region.

16. The semiconductor structure of claim 10, wherein:
the at least one transfer gate electrode comprises a plurality of transfer gate electrodes;
the at least one floating diffusion region comprises a plurality of floating diffusion regions;
one of the plurality of transfer gate electrodes and one of the plurality of floating diffusion region are configured to perform the an image capture operation; and
another of the plurality of plurality of gate electrodes and another of the plurality of floating diffusion regions are configured to perform the at least one additional operation.

17. A CMOS image sensor including an array of pixels located on a substrate semiconductor layer having a doping of a first conductivity type, wherein:
each of the pixels comprises at least one subpixel, and each subpixel comprises a photodetector circuit including a photodetector and a sensing circuit;
the photodetector comprises a second-conductivity-type pinned photodiode layer that forms a p-n junction with the substrate semiconductor layer, a plurality of floating diffusion regions that are electrically isolated from each other or one another and are laterally spaced from a periphery of the second-conductivity-type pinned photodiode layer, and a plurality of transfer gate electrodes;
the photodetector circuit is configured to perform at least two different operations by applying at least two different pulse patterns to the plurality of transfer gate electrodes; and
the at least two different pulse patterns differ provide one another or from each other by at least one of pulse duration, pulse magnitude, and delay time between a control signal applied to the sensing circuit and pulse initiation at a respective one of the plurality of transfer gate electrodes, wherein the at least two different operations comprise an image capture operation and at least one additional operation selected from a phase detection autofocus operation, a single-photon avalanche diode operation, or a near-infrared operation.

18. The CMOS image sensor of claim 17, wherein:

the plurality of floating diffusion regions comprises a first floating diffusion region and a second floating diffusion region;

the plurality of transfer gate electrodes comprises a first transfer gate electrode overlying a first channel region located between the second-conductivity-type pinned photodiode layer and the first floating diffusion region, and comprises a second transfer gate electrode overlying a second channel region located between the second-conductivity-type pinned photodiode layer and the second floating diffusion region; and the sensing circuit comprises a first source follower transistor configured to generate a first output voltage in proportion to electrical charges that accumulate in the first floating diffusion region, and a second source follower transistor configured to generate a second output voltage in proportion to electrical charges that accumulate in the second floating diffusion region.

19. The CMOS image sensor of claim 17, wherein:

one of the plurality of transfer gate electrodes and one of the plurality of floating diffusion region are configured to perform the an image capture operation; and another of the plurality of plurality of gate electrodes and another of the plurality of floating diffusion regions are configured to perform the at least one additional operation.

20. The CMOS image sensor of claim 17, wherein:

the photodetector comprises a plurality of select transistors electrically connected to a respective one of the plurality of floating diffusion regions;

output nodes of the plurality of select transistors are tied to provide a common output node; and gate voltages applied to gate electrodes of the plurality of select transistors are configured to generate only a single output voltage from a selected one of the plurality of select transistors to the common output node during each of the at least two different operations.

* * * * *